United States Patent
Seki et al.

(10) Patent No.: US 7,442,955 B2
(45) Date of Patent: *Oct. 28, 2008

(54) METHOD OF FORMING THIN FILM PATTERNING SUBSTRATE INCLUDING FORMATION OF BANKS

(75) Inventors: Shunichi Seki, Suwa (JP); Hiroshi Kiguchi, Suwa (JP); Ichio Yudasaka, Chino (JP); Hiroo Miyajima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 211 days.

This patent is subject to a terminal disclaimer.

(21) Appl. No.: 11/094,569

(22) Filed: Mar. 31, 2005

(65) Prior Publication Data

US 2005/0186403 A1    Aug. 25, 2005

Related U.S. Application Data

(60) Division of application No. 10/686,634, filed on Oct. 17, 2003, now Pat. No. 7,015,503, which is a continuation of application No. 09/423,969, filed as application No. PCT/JP99/01327 on Mar. 17, 1999, now abandoned.

(30) Foreign Application Priority Data

| Mar. 17, 1998 | (JP) | ................... 10-67508 |
| Feb. 10, 1999 | (JP) | ................... 11-32123 |

(51) Int. Cl.
 *H01L 29/08* (2006.01)
(52) U.S. Cl. .............. 257/40; 257/88; 257/89; 257/59; 438/99
(58) Field of Classification Search .......... 257/40, 257/59, 88, 89, 79, 84; 438/29, 30, 70, 99
See application file for complete search history.

(56) References Cited

U.S. PATENT DOCUMENTS 5,691,011 A    11/1997  Newsham et al.

(Continued)

FOREIGN PATENT DOCUMENTS

JP    61-245106    10/1986

(Continued)

OTHER PUBLICATIONS

IDS Reference Nonaka et al., "Development of Color Filters by Pigment Ink Jet Printing (I) (Fundamental Technology)," Sep. 19, 1997, pp. 238-241.*

(Continued)

*Primary Examiner*—A. Sefer
*Assistant Examiner*—Scott R Wilson
(74) *Attorney, Agent, or Firm*—Oliff & Berridge, PLC

(57) ABSTRACT

Display devices such as EL elements or LED elements, are formed from thin film elements having banks of prescribed height and a thin film layer formed by an ink jet method in areas to be coated that are partitioned by those banks. The banks may be formed of an organic material on a bank formation surface configured of an inorganic material, plasma treatment is performed under conditions that the induction gas is fluorine-based and that fluorine is present excessively, and the areas enclosed by the banks subjected to surface treatment are filled with the liquid thin film material to form the thin film layer or layers.

3 Claims, 24 Drawing Sheets

U.S. PATENT DOCUMENTS

| | | | |
|---|---|---|---|
| 5,948,577 A * | 9/1999 | Nakazawa et al. | 430/7 |
| 6,136,624 A * | 10/2000 | Kemmochi et al. | 438/30 |
| 6,373,187 B1 | 4/2002 | Nagayama et al. | |
| 7,015,503 B2 * | 3/2006 | Seki et al. | 257/40 |
| 2004/0195205 A1 | 10/2004 | Yudasaka | |

FOREIGN PATENT DOCUMENTS

| | | |
|---|---|---|
| JP | 62-109002 | 5/1987 |
| JP | A-63-308920 | 12/1988 |
| JP | 04-121702 | 4/1992 |
| JP | A-6-109912 | 4/1994 |
| JP | A-6-347637 | 12/1994 |
| JP | A-7-234314 | 9/1995 |
| JP | 08-166507 A | 6/1996 |
| JP | 09-015412 | 1/1997 |
| JP | A 9-203803 | 8/1997 |
| JP | A-9-230127 | 9/1997 |
| JP | A-9-230129 | 9/1997 |
| JP | A 9-258208 | 10/1997 |
| JP | B2 2700316 | 10/1997 |
| JP | A 10-153967 | 6/1998 |
| JP | A-11-40354 | 2/1999 |

OTHER PUBLICATIONS

K. Imaisumi et al., "Injection and Transport of Carriers at Organic Interfaces in Organic Light-Emitting-Diode with Oxadiazole Derivatives," *1997 IEEE Annual Report*, Conference on Electrical Insulation and Dielectric Phenomena, Minneapolis, Oct. 19-22, 1997, pp. 459-462.

Nonaka et al., "Development of Color Filters by Pigment Ink Jet Printing (I) (Fundamental Technology)," Sep. 19, 1997, pp. 238-241.

* cited by examiner

FIG.7A  A = ×  a = 5μm, b = 10 μm
FIG.7B  B = △  a = 20μm, b = 10 μm
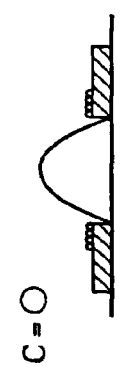
FIG.7C  C = ○  a = 10μm, b = 15 μm
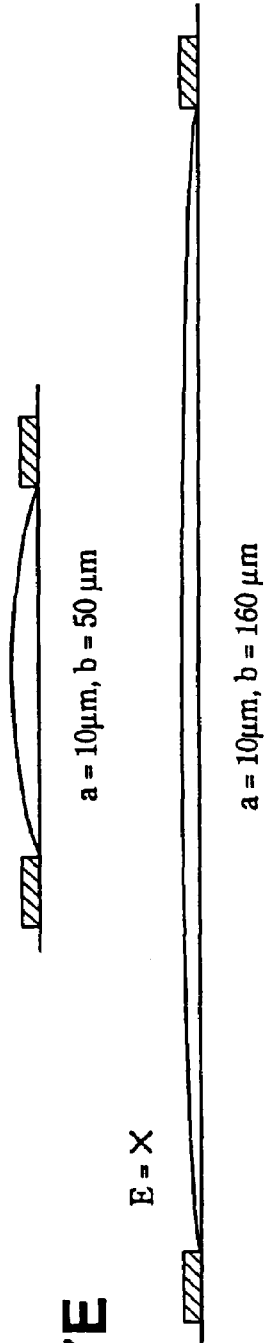
FIG.7D  D = ◎  a = 10μm, b = 50 μm
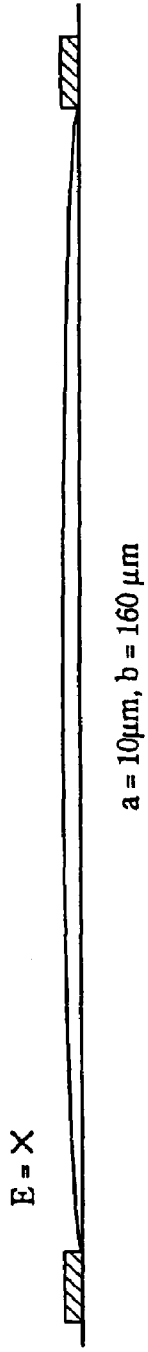
FIG.7E  E = ×  a = 10μm, b = 160 μm

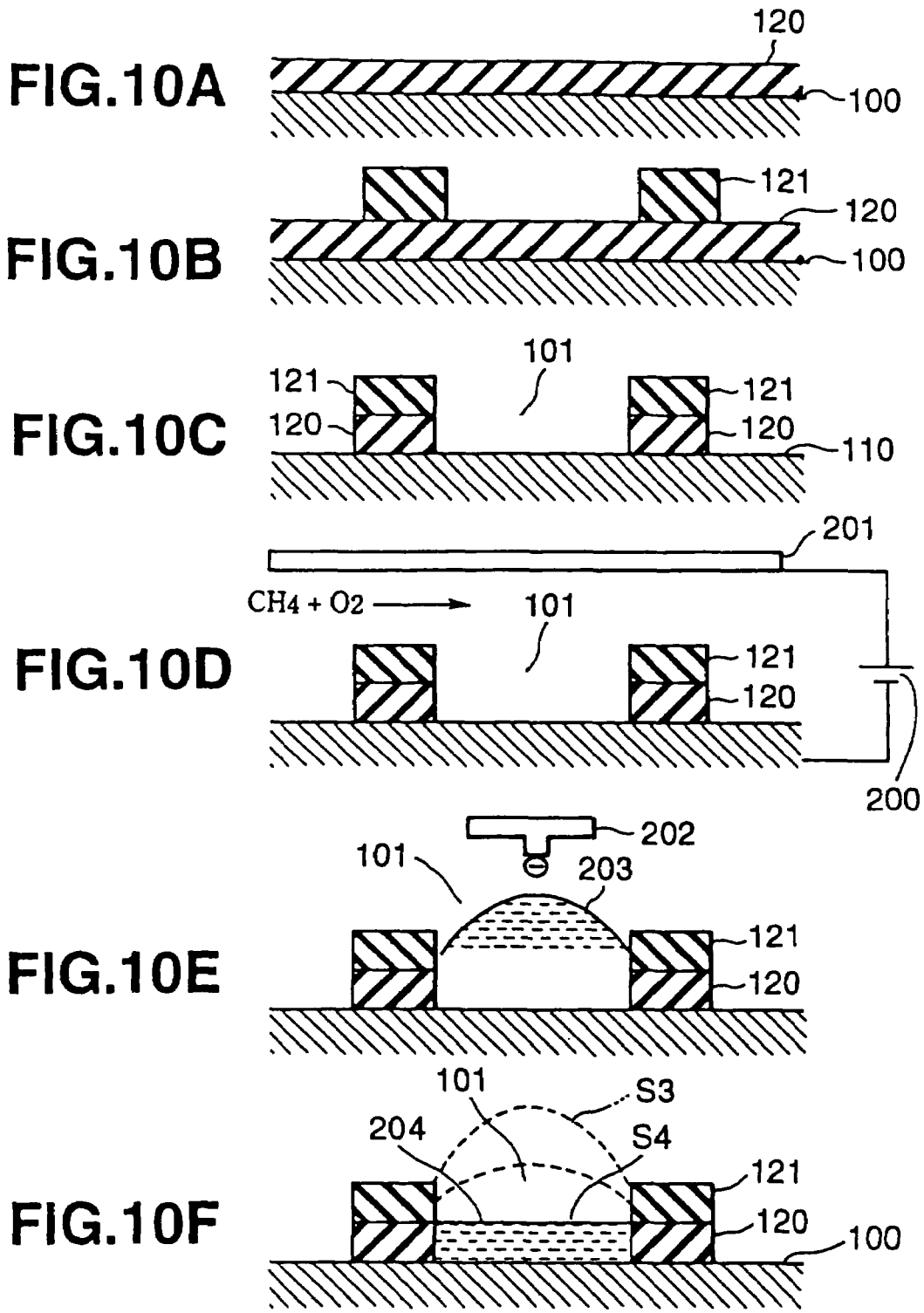

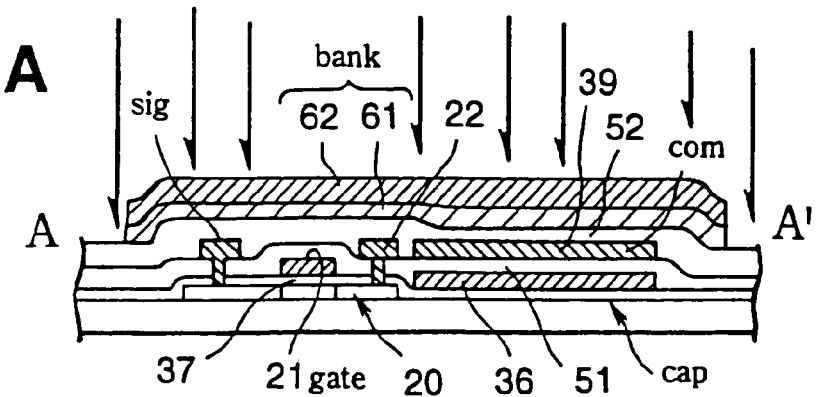
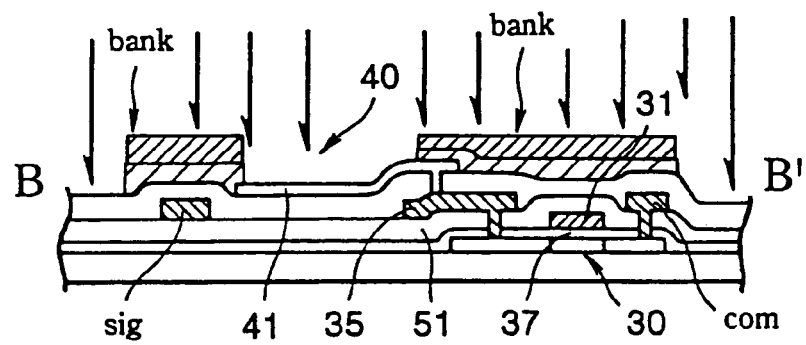
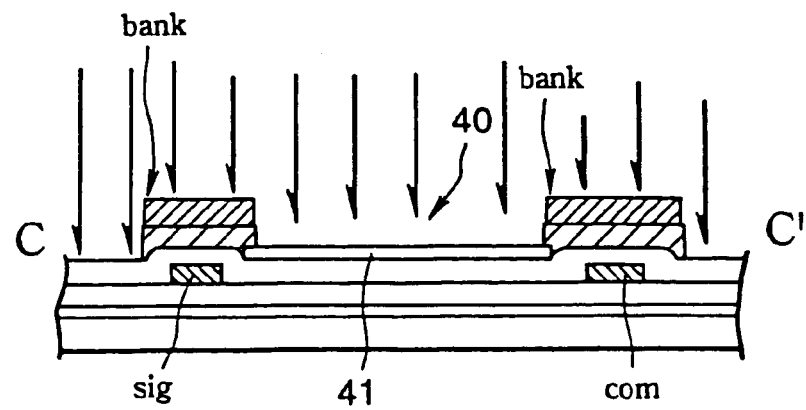

METHOD OF FORMING THIN FILM PATTERNING SUBSTRATE INCLUDING FORMATION OF BANKS

This is a Divisional of application Ser. No. 10/686,634 filed Oct. 17, 2003 which is a Continuation of application Ser. No. 09/423,969 filed Nov. 17, 1999 (now abandoned), which in turn is a U.S. National Stage of PCT/JP99/01327 filed Mar. 17, 1999. The entire disclosure of the prior applications is hereby incorporated by reference herein in its entirety.

TECHNICAL FIELD

This invention relates to thin film formation technology suitable for manufacturing color filters or display elements such as LEDs (light emitting diodes) or EL (electro-luminescence) devices which use organic semiconductor films.

More particularly, the present invention relates to substrates, a thin film formation method, and thin film elements used in forming patterns on substrates when thin films having different properties are formed on the same substrate. The present invention also relates to a method of forming thin films on which fine patterning is required, wherewith it is both easy to form thin film layers using an ink jet process and possible to form flat thin film layers. The present invention further relates to a surface modification method for performing superfine patterning wherewith a liquid thin film material is deployed in areas enclosed in banks formed on a substrate, using an ink jet method or spin coating, etc., as well as to a method that employs this surface modification method in forming thin films and to both a display element comprising such a thin film and a manufacturing method therefor.

BACKGROUND ART

In recent years, technology has been under development for obtaining functional devices by forming prescribed patterns by applying thin films having differing properties on the same substrate. One promising method therefor uses an ink jet process in forming patterns with different thin film patterns on the same substrate. When an ink jet process is used, however, a problem arises at the process surface in that the different thin film materials become mixed on the substrate. In more specific terms, the technology used employs an ink jet process in applying an organic semiconductor material in producing EL devices or other display elements, or a colored resin or other thin film material in producing color filters, but, when the ink jet process is used to deploy a liquid material when forming a thin film pattern, the liquid material that is discharged flows over into adjacent pixels. This presents a problem.

What is commonly done to overcome problems such as this is to provide protruding partitioning members (called "banks" or "risers") to partition off different thin film areas, and then to fill the areas enclosed by these partitioning members with the liquid materials constituting the different thin films. In the display element example noted above, a method is adopted wherein partitioning members are provided to partition off the various pigment areas, and filling the areas enclosed by the partitioning areas with the materials that configure the pixels.

In recent functional devices, and particularly in display elements, thinness is generally demanded, and, despite the fact that this places limitations on the height of the partitioning members, the volume of liquid material deployed in the areas enclosed by the partitioning members is far greater than the volume remaining after film fabrication.

For this reason, problems arise in terms of poor balance between the size of the liquid droplets discharged into the areas enclosed by the partitioning members and the surface areas both of the partitioning member surfaces and of the areas enclosed therein. This problem will now be described further.

In cases where the partitioning members exhibit liquid affinity or wettability relative to the liquid material that is the thin film material to be deployed, the desired film thickness cannot be obtained in the final thin film even when partitioning members are present since [the liquid material] is pulled by the partitioning members. If the volume of liquid material is made greater, moreover, the liquid material readily flows out into the adjacent areas.

Nevertheless, the surfaces of the areas enclosed by the partitioning members need to exhibit strong liquid affinity and wettability relative to the liquid material so that the liquid material will uniformly wet and spread over those surfaces. If that is not the case, the liquid material will not wet and spread over the areas enclosed by the partitioning members, and, with display elements such as EL devices, in particular, color loss and color irregularity will develop in the pixels.

To deal with problems such as these, technology is proposed in Japanese Patent Laid-Open No. 09-203803 and Japanese Patent Laid-Open No. 09-230129, as published, for example, wherein surface treatments are employed to make the upper portions of the partitioning members liquid-repellant and to make the other portions exhibit liquid affinity.

In all of these examples of the prior art, a layer composed of a liquid-repellant material (a layer made of a fluorine compound) is formed on the upper surface of the partitioning members. In Japanese Patent Laid-Open No.09-203803, as published, technology is cited wherein a layer exhibiting non-affinity is coated onto the upper portions of the partitioning members, and the surfaces of the areas enclosed by the partitioning members are treated with a hydrophilic base-surface-active agent. In Japanese Patent Laid-Open No.09-230129, as published, technology is cited for giving the recessed portions enclosed by the partitioning members affinity by additionally exposing them to UV radiation. The theoretical background for this is set forth in "International Display Research Conference 1997," pp 238-241.

However, even when water repellency in the upper surfaces of the partitioning members and liquid affinity in the areas enclosed by the partitioning members are to some degree realized, in cases where the liquid material is applied using an ink jet process, for example, if the size of the liquid droplets discharged is extremely large or small relative to the surface area of the surfaces of the partitioning members noted above or of the areas enclosed thereby, or if the balance therebetween is otherwise very poor, it is known that the liquid material is not accurately deployed in the areas coated, so that high-precision patterning becomes impossible. When, for example, the size of the liquid droplets noted above is larger than the areas enclosed by the partitioning members to too great an extent, the liquid droplets cross over the partitioning members, and, when the upper surfaces of the partitioning members are narrow, the liquid droplets spill over into areas adjacent to the areas being coated.

In cases such as this, when there is an unsuitable relationship between liquid droplet size and the surface area of the areas enclosed by the partitioning members, what happens is that, due to the problems noted earlier, liquid thin film materials become mixed together in the areas enclosed by the partitioning members, and film thickness variation develops in each thin film that is formed.

Problems also arise which relate to the affinity of the partitioning members toward the liquid thin film material when that thin film material is deployed in the areas demarcated by the partitioning members.

The behavior of the liquid thin film material deployed differs according as to what sort of wettability (affinity) toward the liquid thin film material is exhibited by the partitioning members or the areas enclosed by the partitioning members. As noted earlier, when the surfaces of the partitioning members exhibit affinity (hydrophilic property) toward the liquid thin film material, and the volume of the material deployed exceeds the height of the partitioning members, that liquid thin film material will readily flow over into neighboring areas enclosed by partitioning members even when such partitioning members exist. Conversely, when the surfaces of the partitioning members exhibit a proper degree of non-affinity (water repellency) toward the liquid thin film material, that liquid thin film material will not flow over into the neighboring areas enclosed by partitioning members even when the volume of material deployed exceeds the height of the partitioning members, due to the surface tension of the material.

There are also more specific substrate surface modification methods, such as, for example, those described in the previously cited Japanese Patent Laid-Open No. 09-203803 and Japanese Patent Laid-Open No. 09-230129, as published, and also in Japanese Patent Laid-Open No. 09-230127, as published. That is, specifically, technology involving a method for subjecting bank surfaces to an ink-repellency treatment with a fluorine compound (Japanese Patent Laid-Open No. 09-203803, as published), an etching treatment method (Japanese Patent Laid-Open No. 09-230127, as published), and ink-affinity treatment using energy irradiation (Japanese Patent Laid-Open No. 09-230129, as disclosed).

Nevertheless, when member surfaces are made ink-repellent using a fluorine compound or members are formed using a fluorine compound material, in particular, the bonding strength between the fluorine-based material and the underlying layer or underlying substrate forming the members becomes poor, which presents problems in terms of applications to bank-forming technology. Even if the members, and particularly the banks themselves, are formed with an ink-repellent fluorine compound material or the like, residue develops in the bank areas after patterning by photolithography, whereupon there is a danger of the ink affinity of the bank surfaces being impaired.

In the prior art described in the foregoing, moreover, the application, drying, and removal of materials exhibiting non-affinity are necessary just to impart non-affinity to the upper portions of the partitioning members, whereupon the number of process steps inevitably becomes large. Also, when UV irradiation is performed, there is a tendency for affinity with many materials to develop. There has been a tendency for a slight affinity to develop due to UV irradiation, even when the material is one exhibiting non-affinity, thereby negating the effectiveness of the non-affinity treatment. In Japanese Patent Laid-Open No. 09-230129, as published, in particular, there is a provision to the effect that the degree of affinity be controlled by subjecting both the front and back sides to UV radiation, but, in terms of controlling the affinity between non-affinity and affinity, it is not specified how the various angles of contact relative to the liquid thin film material should be established.

When the liquid repellency of the partitioning members is strong, moreover, the liquid of the thin film material is repelled by the side walls of the partitioning members, wherefore the thickness after film formation becomes thick in the center portions of the areas enclosed by the partitioning members and thin about the peripheries thereof. This results in color irregularities in the pixels in the display elements. In EL devices, in particular, shorts readily develop, leading to reduced reliability.

When the surfaces of the partitioning members are subjected to a liquid-repellency treatment and affinity (liquid-affinity) is imparted to the side surfaces thereof, a thin film material is provided wherewith the thickness after film formation does not become thin about the peripheries of the areas enclosed by the partitioning members. Nevertheless, because most of the liquid of the thin film material is pulled to the side surfaces of the partitioning members, not only does the film thickness become greater in the lower skirt portion of the thin film, that is, in the portions in contact with the substrate, but neither is it difficult to control the film thickness.

There are known methods of modifying the surface energy (wettability) of an organic substance which involve performing a plasma process. One example of such a surface modification method is that described in Japanese Patent Laid-Open No. 63-308920/1988, as published. In the surface modification method set forth in this publication, the organic substance surface is treated with a mixed gas plasma containing a fluorine-based gas and gaseous oxygen, and the surface energy of the organic substance is controlled by varying the mixture ratios between the mixture gasses.

Methods involving UV irradiation or oxygen plasma treatment are also well known as procedures for making the surfaces of organic substances such as glass or indium tin oxide (ITO) hydrophilic.

No technology has been reported, however, for simply and rigorously controlling the wettability of each material in the substrate by plasma treatment or UV irradiation in cases where a pattern of layers constituted by organic or inorganic substances is formed on the same substrate. With methods wherein ink repellency is imparted by mixture-gas plasma treatment to an organic substance surface or the surface of a member formed of an organic substance, problems arise, such as being unable to impart ink repellency efficiently, or that the ink repellency of the surface is transient, or having to use a heat treatment, so that the ink repellency deteriorates with the passage of time.

In cases where an ink-affinity treatment is performed using energy irradiation, there is a danger of impairing the ink repellency of the bank surfaces, and it is very difficult to simultaneously achieve both bank surface ink repellency and bank surface ink affinity.

In methods for forming thin films in prescribed patterns where different thin film materials are provided, and particularly in methods for forming thin films wherein liquid thin film materials are deployed in areas enclosed by partitioning members (banks) formed on a substrate, the proper-control of wettability (ink repellency and ink affinity) in the banks and depressions is critical. If the banks do not exhibit ink repellency, not only will ink residue develop on the banks, but, in cases where different liquid thin film materials are deployed in adjacent depressions divided by a bank, those different liquid thin film materials will overflow the bank and be mixed together. When this happens, it is not possible to form thin films having the desired characteristics.

Examples of the formation of thin films using different liquid thin film materials in adjacent depressions divided by banks include color organic EL devices and color filters used in liquid crystal display elements, etc. When these devices are manufactured, however, the banks must exhibit ink repellency and the areas enclosed by the banks, that is, the surfaces of the ITO or glass substrate, must exhibit ink affinity. If the depressions do not exhibit ink affinity, the wetting and spreading within the pixels will be poor, causing color loss and film thickness irregularity.

With the methods described in the foregoing, moreover, in addition to the ink-repellency treatment, an ink-affinity treatment process is also necessary in the pixel areas, that is, in the depressions. Thus these methods involve difficulties in that controlling the ink supplied is difficult and in that the number of process steps becomes large.

DISCLOSURE OF THE INVENTION

It is in the face of these circumstances that the present invention was arrived at. The primary objects of the present invention are, when forming film patterns using thin films of different properties on the same substrate, to prevent liquid thin film materials from flowing over the banks, to be able to form thin film layers that are flat and of uniform thickness with no color irregularities, without fail, with high precision, relatively simply, and with good yield, and to make possible very fine and highly detailed patterning.

A first object of the present invention is to provide thin film elements such as organic EL devices and color filters that—when thin films of an organic semiconductor material or colored resin, etc., are formed by a discharge method such as ink jetting or bubble jetting—are patterned to high precision without the occurrence of mixing in any of the thin film areas, and with remarkably little variation in film thickness. Another object of the present invention incidental to the first object is to provide the thin film patterning substrates to be used when manufacturing these thin film elements, display elements comprising such thin film elements, and thin film formation methods for obtaining these thin film elements.

A second object of the present invention is to provide substrate thin film elements and thin film formation methods wherewith even finer patterning is possible when forming interconnections or other electrically conducting thin films for semiconductor devices, electronic devices, and the like, by a spin-coating or dip method, together with thin film elements formed by such methods, display elements comprising these thin film elements, and electronic equipment comprising these display elements, respectively.

A third object of the present invention is to provide a method for modifying the surface of a substrate whereon are formed banks for the purpose of conveniently and suitably controlling wettability, together with methods for forming thin films using that surface modification method, display elements and display devices comprising these thin films, and manufacturing methods therefor.

A fourth object of the present invention is to provide a thin film formation method wherewith, by managing a plasma process under certain conditions, the affinity between banks and bank formation surfaces can be definitely controlled while the banks themselves maintain high bonding strength with the bank formation surfaces, without requiring numerous process steps for affinity control. Thus the liquid thin film material is prevented from flowing over the banks, yield is improved, and manufacturing costs are reduced.

A fifth object of the present invention is to provide display devices wherewith the liquid thin film material is prevented from flowing over the banks by definitely establishing the affinity between the banks and the bank formation surfaces by managing a plasma process under certain conditions, which display devices have thin film layers of uniform thickness. Thus image display can be effected wherein no irregularities in brightness or color appear, and wherewith reliability is enhanced.

As a result of conducting assiduous research for the purpose of achieving the first object noted above, the inventors discovered that the first object of the present invention can be achieved, in forming thin films using the discharge methods described earlier, by not only adjusting the liquid repellency of the partitioning member surfaces noted above for a liquid material and the liquid affinity of the areas enclosed by the partitioning members, but also optimizing the relationship between the size of the liquid droplets of the liquid material discharged and the surface areas of the partitioning members and the areas enclosed by those partitioning members.

[The inventors] also discovered that, when forming thin films by spin-coating or dipping, in addition to controlling the liquid-material wettability of the partitioning members and the areas enclosed by the partitioning members, by adjusting the surface tension of this liquid material to a certain value, the second object of the present invention, stated above, can be achieved. The present invention was perfected on the basis of such discoveries as these.

Specifically, in order to achieve the first object noted earlier, the present invention is either a thin film patterning substrate comprising a thin film layer pattern formed by an ink jet method on banks of a prescribed height and in areas to be coated which are demarcated by those banks, or a display element formed on that patterning substrate, characterized by the fact that, when the width of the banks is made a ($\mu$m), the height thereof is made c ($\mu$m), the width of the areas to be coated is made b ($\mu$m), and the diameter of the liquid droplets of the liquid material or materials forming the thin film layer or layers is made d ($\mu$m), the banks exhibit the following characteristics.

(1) The banks are formed on the substrate so as to satisfy the relationship $d/2 < b < 5d$. By satisfying this characteristic range, the liquid material will not ride up on the banks, and color mixing inside the pixels is prevented. In addition, this characteristic is augmented by at least one of the following characteristics.

(2) $a > d/4$: When b is small, if $a > d/4$, then the liquid material may ride up on the banks, but mixture of thin film materials inside the areas to be coated is prevented.

(3) $c > t_0$ (where $t_0$ is the film thickness of the thin film layer (in $\mu$m))

(4) $c > d/2b$

In cases where the areas to be coated are stripes or square in shape, the parameters a and c noted above will be constant, but when the pixels are circular, parameter a becomes the shortest distance between pixels, and parameter c becomes the diameter.

The present invention for achieving the second object noted earlier is a thin film element formed so that it has banks of a specific height formed on the substrate, areas to be coated demarcated by those banks, and thin film layers formed by a dipping or spin-coating method in those areas, characterized by the fact that the thin film layers are formed using a substrate subjected to prescribed surface treatment ([for] wettability control), and using liquid material having a surface tension of 30 dyne/cm or less.

By keeping the surface tension of the liquid synthetic resin within this range, it is possible to form patterned thin films of a width of a few microns or less, using a spin-coating or dip method.

The present invention provides thin film formation methods for obtaining these thin film elements, display devices comprising these thin film elements as the display elements, and, furthermore, electronic equipment comprising these display devices.

The invention concept common to the inventions described below and devised by the inventors for achieving the third and following objects noted earlier is a surface modification method for filling areas enclosed by banks on a substrate with a thin film forming material. [The third and following objects are further achieved by] surface modification technology having processes for uniformly subjecting the entire surface of the substrate on which the banks are formed to a series of surface modification treatments, and, by means of that series of treatments, to raise the non-affinity of the bank portion surfaces to the thin film formation material relative to that of the surface of the portions between banks, or by thin film formation technology wherein that surface modification technology is employed, or a thin film patterning substrate wherein that is used, or a display element such as an EL device wherein that is used, or a display apparatus wherein that element is used.

Whereas with the examples of the prior art described earlier, patterning is done after subjecting the entire surface of a photoresist prior to patterning to a water repellency treatment to yield a surface-treated bank pattern, or a surface treatment is performed wherewith masking is done after forming the banks, as based on the present invention, a series of treatments is performed indiscriminately on almost the entire surface of a substrate on which banks have been preformed, whereupon the surface treatments sought can be performed all at once, so that no process of a different type than the surface treatment is involved during the course of plasma treatment or other surface treatment. What is here called a series of surface modification treatments refers to a process, described below, for, most suitably, applying plasma treatments, described below, all at one time to a substrate wherein banks made of an organic material are formed on bank forming surfaces configured by an inorganic material.

Thereupon, the invention for achieving the third object noted earlier is a surface modification method for filling areas enclosed by banks on a substrate with a thin film forming material, comprising: a bank formation process for forming banks with an inorganic material on bank formation surfaces configured by an inorganic material; and a surface treatment process for subjecting the banks and the bank formation surfaces to surface treatment, in cases where prescribed surface treatment has been performed, under certain conditions such that the degree of non-affinity exhibited by the banks for the liquid thin film material becomes higher than that of the bank formation surfaces.

Another aspect of this invention is a thin film formation method for filling the areas enclosed by the banks with a thin film forming material and forming a thin film layer or layers, comprising: a bank formation process for forming banks with an inorganic material on bank formation surfaces configured by an inorganic material; a surface treatment process for subjecting the banks and the bank formation surfaces to surface treatment, in cases where prescribed surface treatment has been performed, under certain conditions such that the degree of non-affinity exhibited by the banks for the liquid thin film material becomes higher than that of the bank formation surfaces; and a thin film layer formation process for filling the areas enclosed by the banks subjected to surface treatment with the liquid thin film material and forming a thin film layer or layers.

What is meant by bank here, as described earlier, is a partitioning member provided for partitioning pixels in a display device wherein organic semiconductor thin film elements are used, for example, or for partitioning pixel areas in a color filter, etc. By bank formation surface is meant a surface on which banks are made, which may be a drive substrate for a display device, etc., or a transparent substrate or the like for a color filter, etc.

For the surface treatment, a reduced-pressure plasma treatment or atmospheric-pressure plasma treatment is performed wherein plasma irradiation is conducted in a reduced-pressure atmosphere or atmospheric-pressure atmosphere, respectively, using an induction gas containing fluorine or a fluorine compound, for example. The certain conditions refer, for example, to the performance of the plasma treatment in a gas containing a fluorine-based compound and oxygen. Under these conditions, unreacted groups are generated by plasma discharge on the surface of the inorganic material, those unreacted groups are oxidized by the oxygen, and polar groups such as carbonyl or hydroxide groups are generated. Polar groups exhibit affinity toward fluids which contain polar molecules such as water, but exhibit non-affinity toward fluids which contain nonpolar molecules. On the organic material surface also, in parallel with the reaction described above, a phenomenon occurs whereby fluorine-based compound molecules invade the organic material surface. In particular, when there is more of the fluorine-based compound than there is of oxygen, and the quantity of the fluorine-based compound is set at 60% or more relative to the total quantity of the fluorine-based compound and the oxygen, the effect of the fluorine-based compound mixing in becomes dominant over the oxidation reaction with the oxygen in a gas atmosphere wherein the quantity of the fluorine-based compound has become excessive, wherefore the surface is rendered non-polar due to that mixing phenomenon which is stronger than the influence of the oxidation reaction. Accordingly, when the organic material is plasma-treated under conditions of excessive fluorine-based compound, non-affinity toward fluids containing polar molecules will be exhibited, while affinity will be exhibited toward fluids containing nonpolar molecules.

The gases used for the gas containing fluorine or a fluorine-based compound include, for example, $CF_4$, $SF_6$, and $CHF_3$, etc. When the surface treatment is performed under these conditions, the surface affinity thereof is adjusted so that the angle of contact with the fluid between the organic material and inorganic material becomes greatly divergent. The surface treatment conditions are set by the surface treatment described above so that the angle of contact with the bank formation surface of the liquid thin film material becomes 20 degrees or less. The surface treatment conditions are also set so that the angle of contact with the bank formation surface of the liquid thin film material becomes 50 degrees or greater. When the banks are formed in two layers, the affinity of the lower bank layer for the liquid thin film material is set, by a surface treatment, so that it is equal to or lower than that of the pixel electrodes but equal to or greater than that of the upper bank layer. The surface treatment conditions are set, for example, so that the surface of the upper bank layer subtends an angle of contact with the liquid thin film material of 50 degrees or less. And the surface treatment conditions are set so that the angle of contact subtended by the lower bank layer with the liquid thin film material is within a range of 20 to 40 degrees.

Whether affinity or non-affinity is exhibited here is determined by the properties of the liquid thin film material that is deployed. If the liquid thin film material is hydrophilic, for example, the surfaces having polar groups will exhibit affinity, while the surfaces having nonpolar groups will exhibit non-affinity. Conversely, if the liquid thin film material exhibits oil-affinity, the surfaces having polar groups will exhibit non-affinity, and the surfaces having nonpolar groups will exhibit affinity. The thin film materials used will vary widely according to the manufacturing objective.

It is preferable that the bank formation process form two layers of banks, namely an upper layer and a lower layer. In one specific example, this bank formation process comprises a lower film layer formation process for forming a lower film layer on the bank formation surfaces, an upper layer formation process for forming an upper layer in conformity with the bank formation areas on the lower film layer, and a removal process that uses the upper layer as a mask and removes, by etching, the lower film layer in the areas where that upper layer is not provided.

In another specific example, the bank formation process comprises a lower film layer formation process for forming a lower film layer on the bank formation surfaces, a process for exposing and developing that lower film layer in conformity with the lower bank layer formation areas, an upper film layer formation process for forming an upper film layer covering the lower layer, and a process for exposing and developing that upper film layer in conformity with the upper bank layer formation areas.

In one example application, pixel electrodes are provided in areas enclosed by banks, and the liquid thin film material is an organic semiconductor material for forming thin film light emitting elements. This is an organic semiconductor display device. The pixel electrodes here may be, for example, ITO electrode films. In specific terms, it is desirable that the banks be made of an insulating organic material such as a polyimide. In cases where a lower bank layer is provided, moreover, silicon oxide film, silicon nitride film, or amorphous silicon is used.

The present invention for achieving the fourth object noted earlier is a surface modification method for filling areas enclosed by banks formed on a substrate with a liquid thin film material. This invention provides a surface modification method which comprises a first process for performing an oxygen plasma treatment on the substrate whereon the banks are formed, and a second process for performing, consecutively, a fluorine-based gas plasma treatment.

By using this method, the surface of the glass, ITO, or other inorganic substrate can be made to exhibit liquid-affinity (affinity) for the liquid thin film material noted above.

The oxygen plasma treatment performed in the first process noted above not only ashes the residue in cases where banks are formed of organic substances on the substrate, but also activates the surface of the organic substance. This is effective in performing liquid-repellency treatment more efficiently in the fluorine-based gas plasma treatment performed immediately thereafter.

In the second process noted above, fluorine-based gas plasma treatment is performed whereby the surface of the organic substance is fluoridized (Teflon-treated), making it possible to impart semi-permanent liquid repellency to the organic substance. With this fluorine-based gas plasma treatment, the liquid affinity exhibited on the substrate is not impaired, and surfaces exhibiting liquid affinity and liquid repellency can be selectively formed on the substrate by a simple method.

Furthermore, at least one of the plasma treatments of the first and second processes described in the foregoing may employ an atmospheric-pressure plasma in a treatment performed under atmospheric pressure. Alternatively, at least one of the plasma treatments of the first and second processes described in the foregoing may employ a reduced-pressure plasma in a process performed under reduced pressure.

If the degree of contamination on the substrate is low, moreover, it is permissible to perform only the fluorine-based plasma treatment. In particular, with a reduced-pressure plasma, the substrate surface can be cleaned, and the organic substance forming the banks can be Teflon-treated.

The substrate mentioned in the foregoing can be configured from an inorganic substance. A substrate surface made of such an inorganic substance can also be made to exhibit liquid affinity.

It is possible to form at least the upper surfaces of the banks formed on the substrate noted above from an organic substance. Alternatively, both the upper surfaces and side surfaces of the banks formed on the substrate can be formed of an organic substance. It is further permissible to form the banks formed on the substrate in two layers whereof the lower layer is formed of an inorganic substance and the upper layer is formed of an organic substance. Alternatively, the banks formed on the substrate can be formed in two layers, whereof the lower layer is formed of an inorganic substance and the upper layer is formed of an organic substance, such that at least the side surfaces of the inorganic substance are not covered by the organic substance.

The surfaces of the organic substance forming the banks may also be made to exhibit liquid repellency (non-affinity). Or the surfaces of the organic substance forming the banks may be Teflon-treated. Alternatively, the surface of the organic substance forming the banks can be made to exhibit liquid repellency and the surface of the substrate formed of one of the inorganic materials noted earlier can be made to exhibit liquid affinity.

Because it is not necessary to use a material that already exhibits liquid affinity for the organic material forming the banks, the range of materials that may be selected is broadened.

Also, surface energy (liquid affinity, liquid repellency) can easily be controlled by such conditions as process time, gas type, gas flow volume, plasma intensity, and the distance from the plasma electrode to the substrate, etc.

The angle of contact subtended by the liquid thin film material noted in the foregoing with the surface of the substrate noted in the foregoing can be made 30 degrees or less, and the angle of contact subtended with the bank surfaces noted above can be made 50 degrees or more.

When the angle of contact subtended by the liquid thin film material with the substrate surface exceeds 30 degrees, the liquid thin film material will not wet and spread over the entire surface of the substrate enclosed by the banks or it will not uniformly wet and spread, so that film thickness irregularities will develop. When, on the other hand, the angle of contact subtended by the liquid thin film material with the bank surfaces is less than 50 degrees, the liquid thin film material adheres to the upper portions of the banks, or is pulled to the bank sides and exceeds the banks, thus flowing into the adjacent substrates. In other words, it becomes impossible to effect patterns of the liquid thin film material at the desired locations.

Furthermore, by forming the banks in two layers, using an inorganic material for the lower layer, and effecting control so that the angle of contact is from 20 to 50 degrees, the problem of the film not adhering to or becoming thin at the skirts of the banks can be resolved.

Accordingly, it becomes possible to employ an ink jet method or spin-coating method to effect liquid thin film material patterning with high precision in areas enclosed by banks using the surface modification method described in the foregoing. If a substrate subjected to surface modification as described above and a thin film formation method based on the ink jet method is employed, it becomes possible to manufacture very fine color filters and full color EL devices simply and at low cost.

The present invention for achieving the fifth object, furthermore, is a method for forming thin films wherewith areas enclosed by banks formed on a substrate are filled with a liquid thin film material. This invention provides a thin film formation method which comprises a process for filling areas enclosed by banks on a substrate subjected to the surface modification described in the foregoing with the liquid thin film material noted earlier, by an ink jet method, immediately after the surface modification.

The present invention, furthermore, for achieving the fifth objective, is a method for forming thin films by filling areas enclosed by banks formed on a substrate with a liquid thin film material, providing a thin film formation method that comprises a process for filling the areas enclosed by the banks on the substrate subjected to the surface modification described in the foregoing with the liquid thin film material noted above, by a spin-coating or dipping method, immediately after that surface modification.

The present invention, furthermore, for achieving the fifth object, provides display devices which comprise thin films formed by the thin film formation method described above. These display devices can be constituted of color filters or organic EL elements or the like.

The present invention, moreover, in order to achieve the fifth object, provides methods for manufacturing display devices wherein thin films are formed by the thin film formation methods described in the foregoing.

BRIEF DESCRIPTION OF THE DRAWINGS

FIG. 7A-7E are cross-sections representing evaluations in reference embodiments;

FIG. 10A-10F are cross-sections of manufacturing processes in a thin film formation method pertaining to a fifth embodiment of the present invention;

FIG. 19A-19C are cross-sections in the A-A' plane, B-B' plane, and C-C' plane, respectively, in FIG. 13; for describing a surface treatment process;

BEST MODE FOR CARRYING OUT THE INVENTION

A first, second, and third embodiment of the present invention, together with modification examples therefor, are now described.

(1) First Embodiment

Aspect Employing Ink Jet Method

In a display device having, on a substrate, banks of a prescribed height, and a thin film layer formed by an ink jet method on the surface of the substrate divided by those banks, when the width of the banks is made a (μm), the height thereof is made c (μm), the width of the areas to be coated, divided by the banks, is made b (μm), and the diameter of the liquid droplets of the liquid material forming the thin film layer is made d (μm), the banks are formed on the substrate so as to satisfy the relationships a>d/4, d/2<b<5d, and c>$t_0$ (where $t_0$ is the film thickness of the thin film layer in μm), and c>1/2× d/b.

Figure 1:
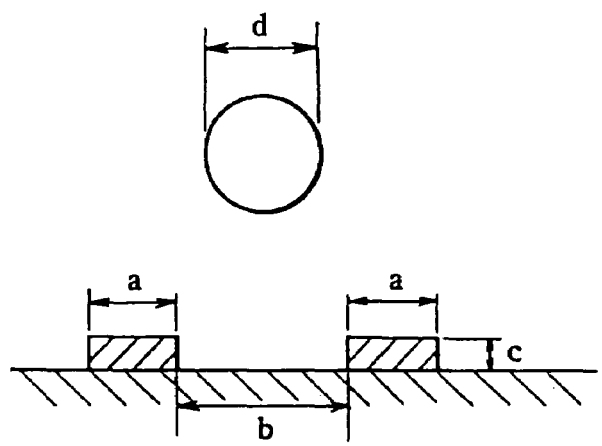
FIG. 1 is a simplified explanatory diagram of the relationship between liquid droplets and a display device of the present invention.

FIG. 1 is a model diagram for describing the relationship between the liquid droplets and the banks provided on the substrate when the display device of the present invention is formed by an ink jet method.

(a) Bank Configuration

The banks (also called risers or partitioning members) provided on the substrate used in the display device of the present invention refer to partitioning members provided for dividing pixels in a display device wherein full color EL elements are employed, or for dividing pixel areas in color filters, for example. As diagrammed in FIG. 1, when the width of the bank is made a ($\mu$m), it is necessary, in order for the liquid material to be coated on uniformly, without overflowing into adjacent pixel areas, that the value thereof be such that a>d/4 relative to the diameter d ($\mu$m) of the liquid droplets of the liquid discharged in the ink jet process, that is, that it be a value that is greater than one fourth the droplet diameter.

The banks are provided on the substrate such that their height is c ($\mu$m). It is preferable, in order to achieve the objects of the present invention, that the value of c ($\mu$m) be set so as to be greater than the thickness $t_0$ ($\mu$m) of the thin film layer to be formed, and so that c>1/2×d/b when b ($\mu$m) is taken as the width of the area to be coated (described below), that is, that that value be greater than half the ratio between the droplet diameter and the width of the area to be coated. In view of the fact that a display device should be as thin as possible, c is made 2 microns or smaller.

Figure 2A:
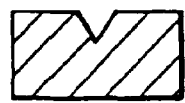
FIG. 2A-2C are cross-sections of example shapes for banks having liquid droplet reservoirs in a display device of the present invention.
Figure 2B:
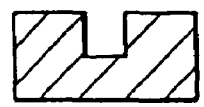
Figure 2C:
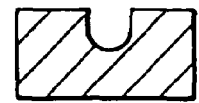

In the present invention, it is desirable that, when performing coating by an ink jet method, to provide prescribed liquid droplet reservoirs in the bank surfaces in order to avoid color mixing due to the overflow of liquid material into adjacent pixel areas when simultaneously coating organic semiconductor light emitting materials or pigments of three colors such as red, green, and blue. It is desirable that these liquid droplet reservoirs be provided in the upper surfaces of the banks, for example, preferably in channel shapes in the center portions thereof. Example shapes thereof are diagrammed in FIG. 2. Specifically, FIG. 2A-2C are cross-sections of banks having the liquid droplet reservoirs described above, with that in FIG. 2A having a V-shaped cross-section, that in FIG. 2B having a square U-shaped cross-section, and that in FIG. 2C having a rounded U-shaped or semispherical cross-section.

By providing such liquid droplet reservoirs as these, when coating is done by the ink jet method, even if the liquid material overflows a targeted pixel it will be caught by the liquid droplet reservoir, and even if the liquid droplets should ride up on the bank they will similarly be caught by the liquid droplet reservoir. As a result, display element color mixing can be avoided.

The banks are members which function as partitioning members. They may be made of a material exhibiting liquid repellency toward the liquid material. As will be described below, they may be made to exhibit liquid repellency (Teflon-treated) by a plasma treatment. For this purpose, an insulating organic material such as a polyimide is used which exhibits good bonding strength with the underlying substrate and readily facilitates photolithographic patterning. In color filters and the like, the partitioning members may additionally perform a shielding function. In order to form these as shielding members, a metal such as chromium or an oxide is used for the black matrix material.

The banks can be formed by any method such as lithography or printing or the like. When a lithographic method is employed, for example, the organic material is coated on, in conformity with the height of the banks, by a prescribed method such as spin coating, spray coating, roller coating, die coating, or dip coating, etc., and a resist layer is coated thereupon. By exposing and developing the resist with a mask applied in conformity with the shape of the banks, the resist is left remaining in conformity with the shape of the banks. Etching is performed to remove the bank material that is not masked. Two or more layers of banks (risers) may also be formed, with the lower layer configured of an inorganic substance and the upper layer of an organic substance.

(b) Substrate Configuration

The banks are formed on the substrate. This substrate may be a drive substrate whereon thin film transistors (TFTs) used in display devices are formed, or it may be a transparent substrate used in color filters. In either case, it is desirable that the surface thereof be formed of a material exhibiting strong bonding strength with the banks. It is particularly desirable that this [substrate surface] be configured of an inorganic material in order to yield suitable affinity in a surface treatment that will be described below. Such materials include, for example, ITO and the like which is a transparent electrode if for a display device, and glass or quartz or the like if for a color filter.

(c) Configuration of Areas To Be Coated and Thin Film Layer

The display device in the present invention has a thin film layer formed by an ink jet method, using a liquid material, on the substrate surface partitioned by the banks described earlier, that is, in the areas to be coated. The substrate whereon those areas to be coated are formed is as described in the foregoing. In the present invention, if d ($\mu$m) is taken as the diameter of the ink jet liquid droplets of the liquid material forming the thin film layer, it is necessary to make the width b ($\mu$m) of each of the areas to be coated a value that is in the range d/2<b<5d. When the value of b is d/2 ($\mu$m) or less, problems ensue, such as that the liquid droplets overflow the areas to be coated or flow via the banks out into the adjacent pixel areas, or as that, even when the banks exhibit liquid repellency, the liquid droplets ride up on the banks. When the value of b is 5d ($\mu$m) or greater, moreover, the liquid droplets spread over the areas to be coated but the film thickness becomes thin, making it necessary to perform a number of repeat coatings in order to obtain the desired film thickness, which is uneconomical. In some cases, furthermore, the liquid droplets do not wet and spread uniformly.

In the present invention, if the areas to be coated, described above, are of the size noted above, there is no particular limitation on the shape thereof. That shape may be any shape at all, such as tetragonal (including rectangular, square, and diamond shaped), polygonal (pentagonal, hexagonal, etc.), a ring shape such as circular (including perfectly circular and elliptical), cross shaped, or any other analogous shape. Nevertheless, because it is desirable that the shape be readily wettable by the liquid droplets in the coating process using an ink jet method, it is particularly desirable, with shapes having edges (such as the apex point or corners in a tetragon), that those edges be curved surfaces. By ensuring that such is the case, when the areas to be coated are filled in with the liquid material, those edges can be made readily wettable.

The liquid material is coated onto the areas to be coated to form a thin film layer. One example application is the organic EL display device. Here the thin film layer is a pixel electrode, and the liquid material is an organic semiconductor material for forming thin film light emitting elements. In this case, the pixel electrode is an ITO electrode film, for example.

(d) Surface Treatment

In the present invention, it is desirable that the substrate material of the areas to be coated and the banks be subjected to surface treatment so that the bank surfaces will exhibit a higher degree of non-affinity for the liquid material than the areas to be coated. It is preferable that, by such surface treatment, the angle of contact of the liquid material for the bank surfaces be 50 degrees or greater, and also that the angle of contact of the areas to be coated for the substrate material be 20 degrees or less. By insuring that such is the case, the liquid material will not exceed and overflow the banks, even if the volume of liquid material discharged is large compared to the thickness of the thin film layer, and filling is done only in the prescribed areas to be coated.

For the surface treatment described above, the induction gas used may be a gas that contains fluorine or a fluorine-based compound, in an atmospheric-pressure plasma treatment or reduced-pressure plasma treatment wherein plasma irradiation is performed in an atmospheric-pressure environment or a reduced-pressure environment, respectively, containing the fluorine-based compound and oxygen. Examples of gasses containing fluorine or a fluorine-based compound include $CF_4$, $SF_6$, and $CHF_3$.

(e) Thin Film Formation

In the present invention, the liquid material is coated and a thin film layer is formed by an ink jet method in the areas to be coated that are partitioned by the banks described earlier. By employing an ink jet method, any area to be coated can be filled with any quantity of liquid material, and filling is even possible with a small apparatus such as is used in a home printer. In the present invention, by optimizing the shapes and sizes of the banks and the areas to be coated that are partitioned by the banks, thin film layers are obtained wherewith no color mixing with neighboring pixels occurs and there is no variation in film thickness from pixel to pixel.

The discharge quantity in the ink jet process is made such as to yield the desired thickness in cases where the volume declines due to post-coating heat treatment. It is permissible, depending on the case, to implement an additional deployment process after drying to obtain the desired thickness. The normal viscosity for discharging [the liquid material] from the ink jet recording head is several cP.

In the present invention, the size of the banks and the width of the areas to be coated are specified relative to the size of the liquid droplets discharged. Therefore, even when a large volume of liquid material is discharged relative to the thickness of the thin film layer, the liquid material does not exceed and overflow the banks, and the prescribed areas to be coated are filled. After the liquid material has been deployed, in cases where that material contains a solvent, the solvent component is removed by performing a heat treatment and/or a reduced-pressure treatment, whereupon the volume of liquid material decreases and the thin film layer is formed in the areas to be coated. At this time, the surface of the areas to be coated, that is, the substrate surface, has been surface-treated to exhibit liquid affinity, as described earlier, wherefore the thin film layer will adhere well. The liquid material used can be an organic semiconductor material for a display device or a colored material or the like for a color filter. The organic semiconductor material used may be an organic light emitting material that emits light of colors selected from among red, green, and blue, for example.

The ink jet process employed may be either a piezo-jet process or a method that effects discharge by heat-induced foam generation. The piezo-jet process is to be preferred, however, in that it involves no fluid degradation due to heating.

(2) Second Embodiment

Aspect Employing Dipping or Spin-Coating Method

The inventors discovered that, in a display device having a thin film layer formed by a dipping or spin-coating method, wherein banks of a prescribed height and areas to be coated partitioned by those banks are provided on a substrate, and surface treatment is performed as desired, the objects of the present invention can be achieved even with a thin film formation method characterized by the fact that the thin film layer is formed using a liquid material having a surface tension of 30 dyne/cm. In particular, with the display device described above, unlike in cases where coating is done using an ink jet process, the objects mentioned can be achieved by controlling the surface energy of the liquid material in addition to the surface energy of the banks and substrate, without imposing any limitation whatever on the shape or size of the banks or areas to be coated. It is therewith possible, furthermore, to effect even finer patterning than with the ink jet method. In particular, by controlling the surface tension within a range, effective utilization is possible in fine patterning applications such as metal wiring, etc., and patterning with a width of a few μm is possible. This is also effective in cases where a common material is used with R, G, and B for the hole injection layers employed in the manufacture of organic EL elements.

The properties of the materials used here for the substrate, banks, and areas to be coated are the same as when coating is done using the ink jet process noted earlier. It is desirable, furthermore, that the same surface treatment be performed on the bank surfaces and areas to be coated as in the ink jet process case. Accordingly, it is desirable that the substrates that are the banks and the areas to be coated each subtend an angle of contact of 50 degrees or greater, or 30 degrees or less, with the liquid material. The dip process and spin-coating process can each be performed by a method commonly used in the respective commercial field.

(3) Third Embodiment

Specific Embodiment Aspect of Display Device (Configuration)

Figure 3:
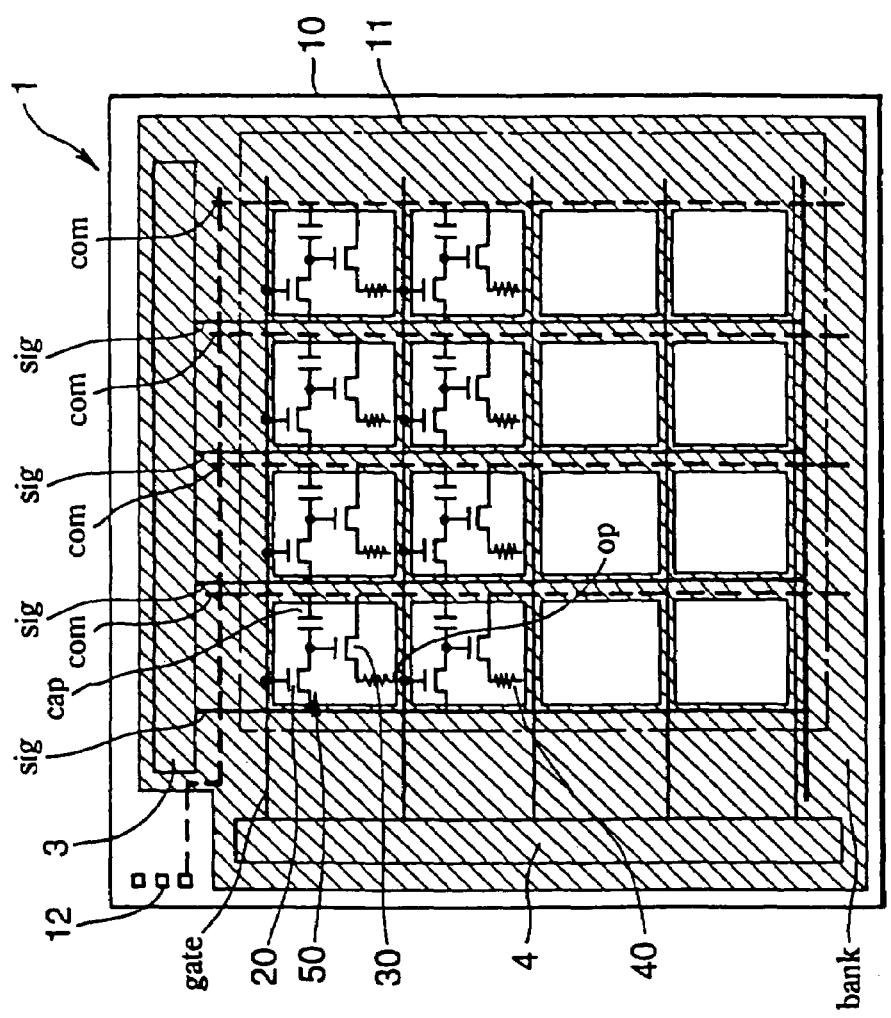
FIG. 3 is a model block diagram of the overall layout of one example of an active-matrix type display device relating to a display device of the present invention.
Figure 4:
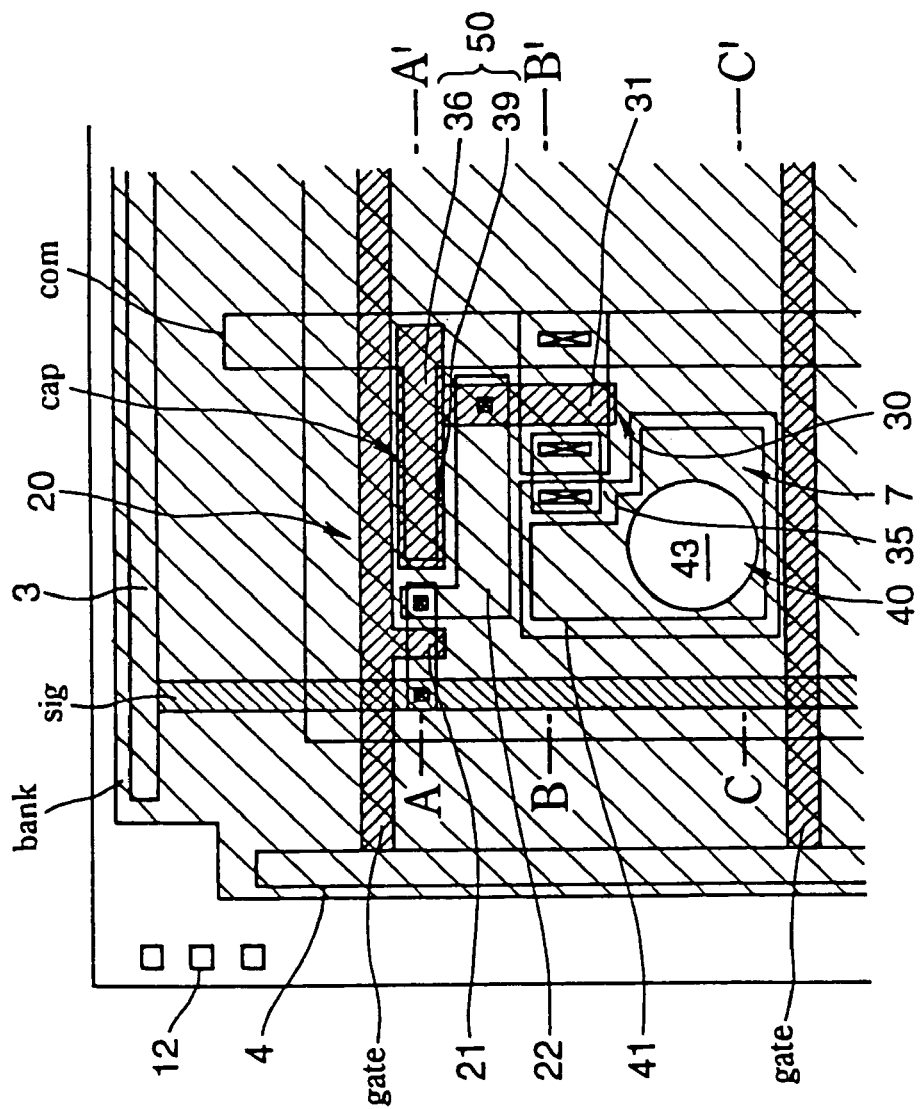
FIG. 4 is a plan of one pixel comprised in the active-matrix type display device diagrammed in FIG. 3.
Figure 5A:
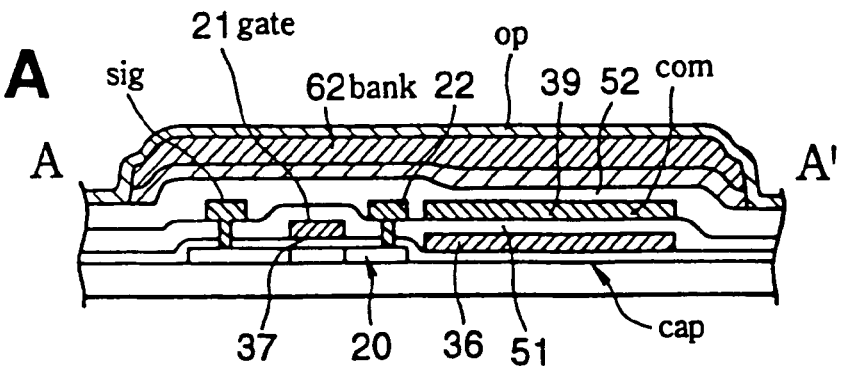
FIG. 5A-5C are cross-sections in the A-A plane, B-B plane, and C-C plane, respectively, in FIG. 4.
Figure 5B:
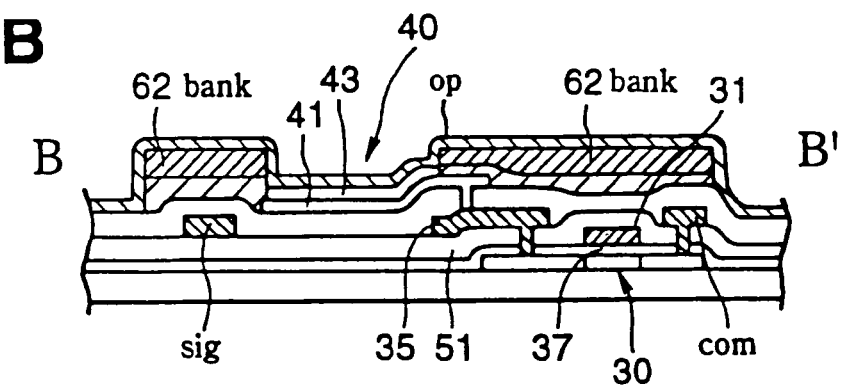
Figure 5C:
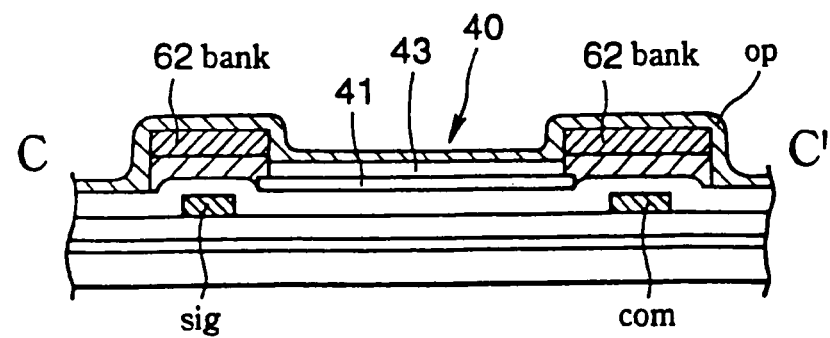

FIG. 3 is a model block diagram of the overall layout of an active-matrix type display device in this embodiment aspect. FIG. 4 is a plan of one pixel in FIG. 3, and FIG. 5A-5C are cross-sections in the A-A plane, B-B plane, and C-C plane, respectively, in FIG. 4.

The active-matrix type display device of this embodying aspect comprises a display unit 11 in the center portion of a transparent substrate 10. In the peripheral portion of the transparent substrate 10 is provided a data-side drive circuit 3 and a scanning-side drive circuit 4. Data lines SIG are wired to the display unit 11 from the data side drive circuit 3, and scanning lines GATE are wired from the scanning side drive circuit 4. In these drive circuits 3 and 4 are configured complimentary TFTs by an N-type TFT and a P-type TFT (not shown). These complementary TFTs configure shift register circuits, level shifter circuits, and analog switch circuits, etc., configured so that they can amplify the power of data signals and scanning signals supplied from the outside.

In the display unit 11, as in the active-matrix substrate in a liquid-crystal active-matrix type display device, a plurality of pixels 7 are deployed on the transparent substrate 10. From the drive circuits 3 and 4 a plurality of scanning lines GATE and a plurality of data lines SIG are wired so that they cross, with one set comprising a data line SIG and a scanning line GATE being deployed for each pixel 7. In addition to the data lines SIG and scanning lines GATE that cross in matrix fashion, a common power supply line COM is wired so as to pass close to each pixel.

Each of the pixels 7 is formed in a circular depression having a diameter of 50 μm, for example, enclosed by a bank layer. The bank layer partitioning the pixels has a width of 10 μm and a height of 2 μm, made of a material as previously described. A poly(para-phenylenevinyline) (PPV) precursor solution or other organic semiconductor material solution is used for the liquid material (wherein the PPV precursor solution is diluted with DMF, glycerin, and diethylene glycol to make an ink). This liquid material is discharged into the areas to be coated enclosed by the banks using an ink jet process, and heated to form an organic semiconductor film 43. The hole injection-carrier layer may have a laminar structure formed by ink-jetting or spin-coating an electrically conductive material such as a polyethylene dioxythiophene.

Each pixel 7 comprises a conductivity control circuit 50 and a thin film light emitting element 40. The conductivity control circuit 50 comprises a first TFT 20, holding capacitor CAP, and a second TFT 30. The first TFT 20 has scanning signals supplied to the gate electrode thereof via a scanning line GATE. The holding capacitor CAP is configured so that it can hold image signals supplied from the data line SIG via the first TFT 20. The second TFT 30 has the image signals held by the holding capacitor CAP supplied to the gate electrode thereof. The second TFT 30 and the thin film light emitting element 40 are connected in series between the common power supply line COM and an opposing electrode OP.

The first TFT 20 and second TFT 30 are formed by island-shaped semiconductor films as diagrammed in FIG. 4 and FIG. 5A-5C. The first TFT 20 has a gate electrode 21 configured as part of the scanning line GATE. In the first TFT 20, a data line SIG is electrically connected to one source-drain region via a contact hole in a first interlayer insulating layer 51, while to the other is electrically connected a drain electrode 22. To the drain electrode 22 is electrically connected the gate electrode 31 of the second TFT 30 via a contact hole in the first interlayer insulating layer 51. To one of the source-drain regions in the second TFT 30 is electrically connected a relay electrode 35 formed simultaneously with the data lines SIG, via a contact hole in the first interlayer insulating film 51. To the relay electrode 35 is electrically connected a transparent electrode 41 in the thin film light emitting element 40 via a contact hole in a second interlayer insulating film 52. ITO, for example, is used for the transparent electrode.

To the other source-drain region in the second TFT 30 is electrically connected the common power supply line COM, via a contact hole in the first interlayer insulating film 51. An extension 39 of the common power supply line COM is deployed in opposition to an extension 36 of the gate electrode 31 of the second TFT 30, with the first interlayer insulating film 51 interposed therebetween as a dielectric film, thereby configuring the holding capacitor CAP. This holding capacitor CAP may, instead of having the structure described above wherein it is formed between the common power supply line COM, be formed between the scanning line GATE and a capacitor line formed in parallel therewith. Alternatively, the holding capacitor CAP may be configured using the drain region of the first TFT 20 and the gate electrode 31 of the second TFT 30.

The thin film light emitting element 40 enclosed by the bank layer is formed independently in each pixel 7. In this thin film light emitting element 40, on the upper layer side of the pixel electrode 41, the organic semiconductor layer 43 is formed as a light emitting thin film, and the opposing electrode OP is formed, in that order, in laminar fashion. A material that emits light by the application of an electric field, such as a poly(para-phenylene) (PPV), is used for the organic semiconductor film 43. Instead of providing the organic semiconductor film 43 for each pixel, it may be formed as a stripe that crosses over a plurality of pixels 7. For the opposing electrode OP, an electrically conductive material that reflects light, such as a film of a metal such as aluminum containing lithium, or calcium, etc., is used. The opposing electrode OP is formed in areas excluding the entire display unit 11 and at least that area where a terminal 12 is formed.

For the thin film light emitting element 40, a structure may be adopted wherein a hole injection layer is deployed to enhance the light emission efficiency (electron injection efficiency), as described in the foregoing, or a structure wherein an electron injection layer is deployed to enhance the light emission efficiency (electron injection efficiency), or, alternatively, a structure wherein both a hole injection layer and an electron injection layer are formed.

(Manufacturing Method for Display Device)

A method for manufacturing an active-matrix type display device having the configuration described in the foregoing is next described.

Semiconductor layer formation process: First, on the transparent substrate 10, as necessary, an underlayer protection film is formed that consists of a silicon oxide film having a thickness of approximately 2000 to 5000 Ångstroms. This underlayer protection film is formed by a plasma CVD method using TEOS (tetraethoxy silane) or oxygen gas as the raw material gas. Then, on the surface of this underlayer protection film, a semiconductor film is formed that consists of an amorphous silicon film having a thickness of approximately 300 to 700 Ångstroms. This semiconductor film is formed by a plasma CVD method also. Next, the semiconductor film consisting of the amorphous silicon film is subjected to a crystallization process using a laser annealing or fixed growth process or the like to crystallize the semiconductor film to a polysilicon film. Next, the semiconductor film is patterned to make an island-like semiconductor layer. The surface thereof is then subjected to a plasma CVD process, using TEOS (tetraethoxy silane) or oxygen gas as the raw material gas, to form a gate insulating film 37 consisting of a silicon oxide or nitride layer having a thickness of approximately 600 to 1500 Ångstroms. Next, after forming an electrically conductive film consisting of a film of a metal such as aluminum, tantalum, molybdenum, titanium, or tungsten, etc., patterning is performed to form the gate electrodes 21 and 31 and the extension 36 of the gate electrode 31. In this process the scanning lines GATE are also formed.

In this condition, highly concentrated phosphorous ions are implanted to form source-drain regions in self-matching fashion with the gate electrodes 21 and 31. The portions into which impurities are not introduced become channel regions. Next, after forming the first interlayer insulating film 51, the contact holes are formed, and the data lines SIG, drain electrode 22, common power supply line COM, extension 39 of the common power supply line COM, and the relay electrode 35 are formed. As a result, the first TFT 20, second TFT 30, and holding capacitor CAP are formed.

Next, the second interlayer insulating film 52 is formed and a contact hole is formed in this interlayer insulating film in the portion corresponding to the relay electrode 35. Next, after forming an ITO film over the entire surface of the second interlayer insulating film 52, patterning is performed, and a pixel electrode 41 is formed, for each pixel 7, electrically connected to the source-drain region in the second TFT 30 via the contact hole.

Insulating film formation process: Next, an insulating film 62 is formed along the scanning lines GATE and data lines SIG. The insulating film 62 is configured of an organic insulating material such as any of the polyimides mentioned earlier. For the width and thickness of this insulating film 62, values are selected which are optimized for the diameter of the liquid droplets when the liquid material is coated on by the ink jet process as described earlier.

Surface treatment process: Following that, a plasma treatment is conducted using a gas containing fluorine so as to effect affinity (a hydrophilic property when the liquid material contains water) in the surface of the pixel electrode 41 for the liquid material, with the angle of contact set at 20 or lower, for example, and non-affinity in the insulating film 62 for the liquid material, with the angle of contact set at 50 or higher, for example.

Organic semiconductor (organic EL element) film formation process: After the surface treatment described above, the organic semiconductor films 43 corresponding to R, G, and B are formed by an ink jet process in the areas to be coated partitioned in circular shapes by the banks. That is, the liquid material that is the material for configuring the organic semiconductor film 43 is discharged from the ink jet recording head for the circular areas to be coated enclosed by the bank layer. In a specific example, for the red light emitting layer material, the PPV precursor made into ink as noted above and doped with pigments such as rhodamine or beliren, or a PPV precursor (MHE-PPV) made into ink, was used. For the material for the blue light emitting layer, a polyfluorine derivative made into ink by dissolving it in an aromatic solvent such as xyline was used. The droplet diameter thereof was 30 μmφ.

Following thereupon, in the case of a PPV precursor solution (a PPV precursor solution diluted with DMF and made into ink), the solvent is removed under reduced pressure, a heat treatment is performed at 150° C. to effect conjugation, and this is fixed to the areas to be coated to form the organic semiconductor film 43. Here, the sizes and shapes of the bank layer and areas to be coated are set at values optimized for the 30 μmφ diameter of the liquid material droplets, wherefore the area of coating with the organic semiconductor film 43 is definitely defined by the bank layer, and does not run out into the adjacent pixels 7. In addition, because the bank layer exhibits non-affinity for the liquid material and the areas to be coated exhibit affinity for the liquid material, the liquid material does not adhere to the side walls of the banks. As a result, the organic semiconductor film 43 formed after heat treatment is maintained in a uniform thickness on each pixel electrode and pixel electrode.

When the organic semiconductor film is formed as a multilayer-structure element, moreover, as when forming a light emitting layer, hole injection layer, and electron injection layer in laminar fashion, the liquid material deployment (using an ink jet process) and drying operations need only be repeated once for each layer. Alternatively, when a common material can be used for R, G, and B in the hole injection layer and electron injection layer, it is possible to form patterns only in the pixel areas, even using a spin-coating or dipping process, if the surface tension of the liquid material is adjusted to 30 dyne/cm or less. In a specific example, a water dispersion wherein a polystyrene sulfonic acid was added to a hole injection material (such as a polythiophene derivative such as polyethyline dioxythiophene, for example) used in an organic EL element was diluted with a cellosolve-based solvent of low surface tension, or an alcohol having low surface tension such as methanol, or some other water-soluble solvent to adjust the surface tension to 30 dyne/cm or lower.

Such spin-coating solutions exhibited angles of contact of 60° or greater with surface-treated (plasma-treated) banks, and of 20° or greater with ITO surfaces.

Once the organic semiconductor films 43 are formed, the opposing electrode OP is formed over roughly the entire surface of the transparent substrate 10 and the active-matrix type display device is complete.

With a manufacturing method such as described in the foregoing, an ink jet process can be used to form the organic semiconductor films 43 corresponding to R, G, and B in the prescribed areas, wherefore full color active-matrix type display devices can be manufactured with high productive yield. Also, because the organic semiconductor films can be formed with uniform thickness in each pixel, there will be no irregularities in brightness. And, because the thickness of the organic semiconductor films is uniform, the drive current will not be concentrated in some part of the thin film light emitting element 40, whereupon declines in the reliability of the thin film light emitting element 40 can be prevented.

Furthermore, TFTs are formed also in the data side drive circuit 3 and scanning side drive circuit 4, but [the formation of] these TFTs is performed by invoking all or part of the process wherein TFTs are formed in the pixels 7. Because of that, the TFTs configuring the drive circuit will be formed between the same layers as the TFTs of the pixels 7. The first TFT 20 and the second TFT 30 may, furthermore, both be N types, both be P types, or one be an N type and the other a P type. Irrespective of which of these combinations is used, however, the TFTs can be formed by a commonly known method.

(Other Modification Examples)

The present invention is not limited to or by the embodying aspects described in the foregoing, but can be implemented in various modifications within the scope of the present invention.

Figure 6:
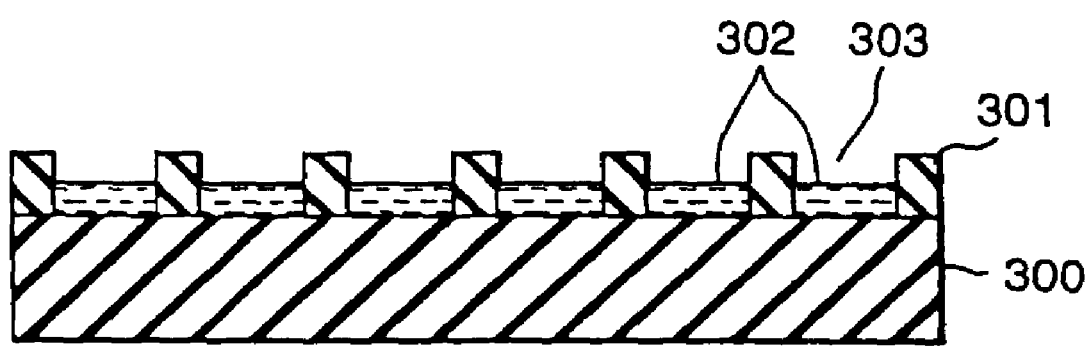
FIG. 6 is a cross-section of one example of a color filter in an application of the present invention.
Figure 8A:
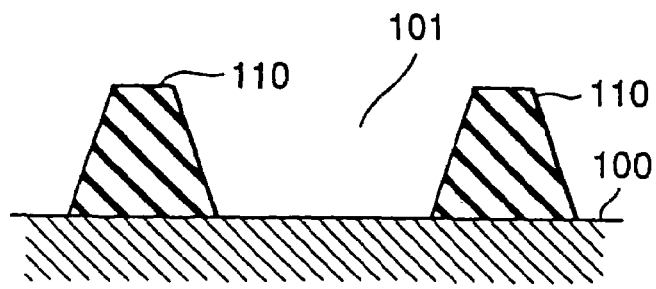
FIG. 8A-8D are cross-sections of manufacturing processes in a thin film formation method pertaining to a fourth embodiment of the present invention.
Figure 8B:
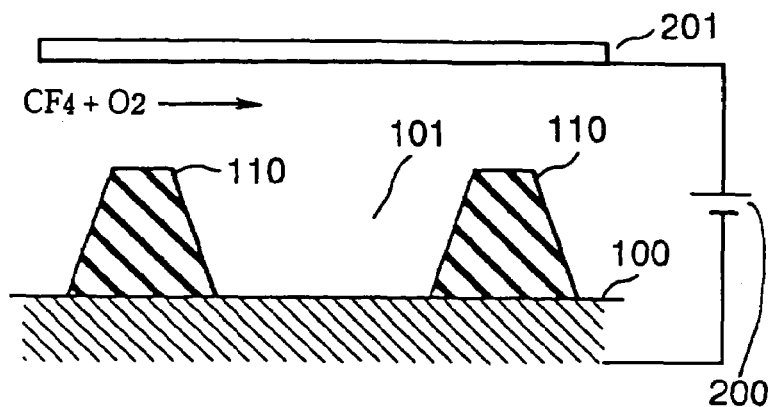
Figure 8C:
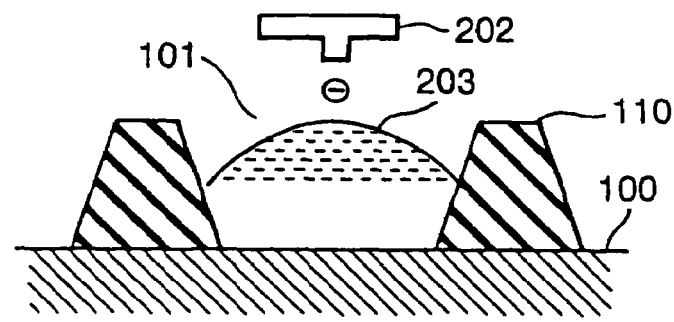
Figure 8D:
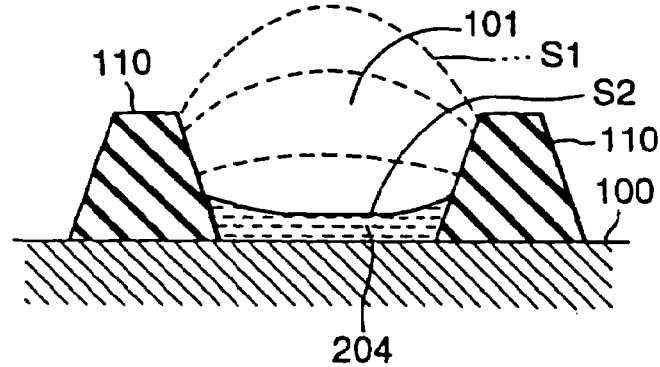

As an example, the present invention can be applied to color filters. In FIG. 6 is diagrammed a cross-section of one example of a color filter wherein the present invention is applied. In this case, a transparent substrate 300 made of glass or quartz is used for the substrate, partitioning members 301 formed of a resin or other black material are used for the banks, and a colored resin 302 is used for the liquid material. For the partitioning members 301, a black matrix may be formed using a black pigment or dye, or a metallic film of chromium oxide or chromium. After forming the partitioning members 301 on the transparent substrate 300, the areas to be coated 303 enclosed by the partitioning members 301 are filled with the colored resin 302 in an ink jet process. The present invention can also be employed in any other way, so long as it is obtained by filling depressions enclosed by partition-shaped members with any fluid, and so long as it includes a manufacturing method therefor.

In specific examples, the width a of the bank and the width b of the areas to be coated were varied as indicated in Table 1, display devices such as diagrammed in FIG. 6 were fabricated having a bank height c of 2 μm, and the areas to be coated were coated with a coating liquid having a droplet diameter d of 30 μm in an ink jet process. The results are given in Table 1, evaluated by the evaluation criteria noted below, under the other conditions noted below.

Bank material: Polyimide (may be a laminar bank structure using $SiO_2$+polyimide)

Substrate material: ITO

Angle of contact with bank surface: 60 degrees (plasma treatment)

Angle of contact with areas to be coated: 10 degrees (plasma treatment)

Liquid material: Polyparafenylene vinylene precursor solution (an ink made by dissolving a PPV precursor in a solution comprising mainly DMF, and adding thereto a small amount of glycerin and diethylene glycol)

Evaluation Criteria

◎: Liquid droplets are completely accommodated in depressions without any residue left on the banks (cf. FIG. 7D); simultaneous discharge of R, G, and B is possible.

○: Liquid droplets are accommodated in depressions, but slight residue is left on banks (cf. FIG. 7C)

Δ: Liquid droplets ride up onto banks (cf. FIG. 7B); simultaneous discharge of R, G, and B is not possible.

×: Liquid material flows over into adjacent depressions (cf. FIG. 7A); wetting does not completely spread throughout depressions (cf. FIG. 7E); even if wetting does spread, film thickness is thin, requiring multiple repeat applications.

Table 1 [cf. orig.]

As described in detail in the first, second, and third embodiment and modification examples thereof, it is possible with an ink jet process, by optimizing the sizes of banks and areas to be coated relative to the droplet diameters in a liquid material, to obtain display devices wherein there is no color mixing between pixels and extremely little variation in film thickness from pixel to pixel. Simultaneous R, G, and B patterning is also possible therewith.

It is further possible in a spin-coating or dip process to effect even finer patterning by defining the surface tension of the liquid material.

The present invention may also be effectively employed in applications, whether they be display devices or not, such as in the formation of electronic devices such as TFT devices on wired substrates used therein, and in organic EL devices, display devices, and color filters.

Fourth to seventh embodiments, and modification examples thereof, are now described.

(4) Fourth Embodiment

A fourth embodiment of the present invention relates to a thin film formation method used when forming banks of a single material. Manufacturing process cross-sections for this embodiment are diagrammed in FIG. 8A-8D. This embodiment has banks provided in any desired shape on a bank formation surface, and may be employed in all kinds of applications wherein areas partitioned by banks are filled with a prescribed fluid. It is possible to employ this embodiment, for example, in cases where pixel areas are filled with an organic semiconductor material in a display device that uses organic semiconductor thin film elements, and in cases where pixel areas are filled with a colored resin in color filters.

Bank formation process (FIG. 8A): The bank formation process is a process wherein banks are formed on a bank formation surface. The bank formation surface may be either a drive substrate whereon are formed thin film transistors (TFTs) used in display devices, or a transparent substrate used in a color filter. There is no limitation on the structure of the bank formation surface so long as the objective is to form thin films by filling areas enclosed by banks that constitute partitioning members with a fluid. It is nevertheless desirable that that surface be formed of a material exhibiting high bonding strength with the banks. It is particularly desirable that it be configured of an inorganic material in order to obtain the proper affinity in a subsequent surface treatment. This surface may be constituted of ITO if for a transparent electrode, or of glass or crystal if for a color filter.

The banks are members that function as partitioning members. Thus it is preferable that they be configured of a polyimide or other insulating organic material. That material may exhibit an insulating property, or the properties of a semiconductor, or electrical conductivity. It is particularly desirable that the banks be formed of an organic material in order to obtain the proper non-affinity in a subsequent surface treatment. In a color filter or the like, the partitioning members may also be given a shielding function. In order to form shielding members, chromium or another metal or oxide is employed as a black-matrix material. Any method may be selected for forming the banks, such as a lithographic or printing method. When a lithographic method is employed, the organic material is coated on, in conformity with the height of the banks, by a prescribed method such as spin coating, spray coating, roller coating, die coating, or dip coating, etc., and a resist layer is coated thereupon. By exposing and developing the resist with a mask applied in conformity with the shape of the banks, the resist is left remaining in conformity with the shape of the banks. Etching is performed last of all to remove the bank material that is not masked. When a printing method is used, the organic material is coated directly in the bank shape, by any method, such as intaglio printing, planography, or relief printing. The banks 110 are formed with a height wherewith the liquid thin film material will not overflow into adjacent depressions, due to surface tension, when the depressions 101 enclosed by the banks are filled with the liquid thin film material. If the thin film layer, after heat treatment, is formed with a thickness of 0.05 μm to 0.2 μm, for example, the banks 110 are formed with a height of 1 μm to 2μ or so.

Surface treatment process (FIG. 8B): With the plasma treatment of the present invention, a gas containing fluorine is used as the induction gas. This may be either a reduced-pressure plasma treatment conducted in a reduced-pressure atmosphere, or an atmospheric-pressure plasma treatment conducted in an atmospheric-pressure atmosphere. It is preferable that a certain amount of oxygen be present in the reaction gas. A halogen gas such as $CF_4$, $SF_6$, or $CHF_3$ is used as a fluorine-based compound.

Figure 9:
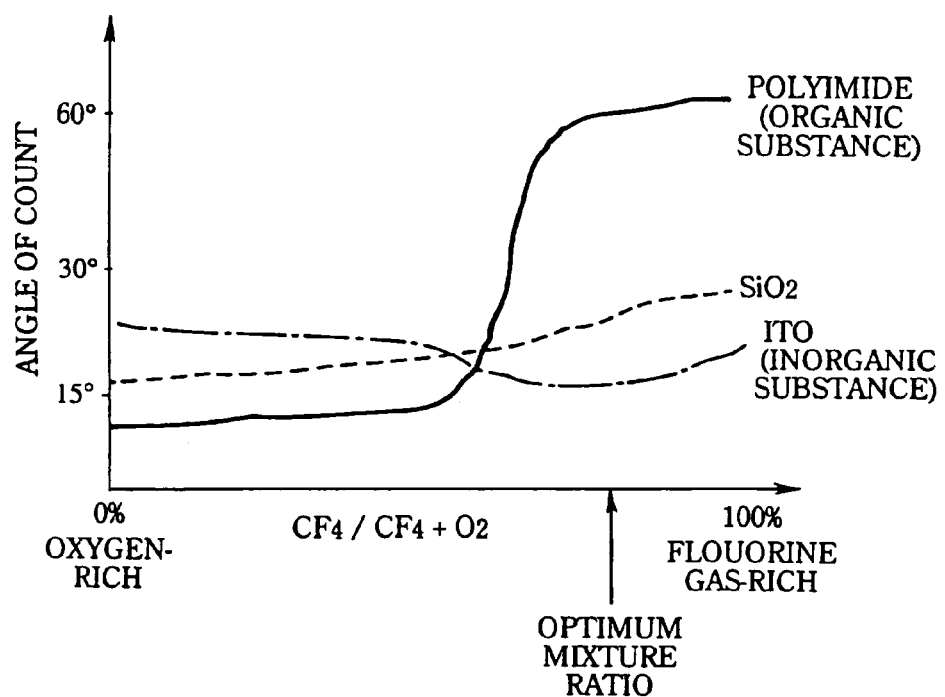
FIG. 9 is a characteristic diagram for describing the relationship between the angle of contact and the mixture ratios of oxygen and a fluorine-based compound pertaining to the theory of surface treatment in the present invention.
Figure 11A:
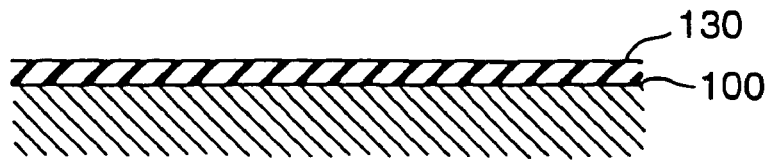
FIG. 11A-11F are cross-sections of manufacturing processes in a thin film formation method pertaining to a sixth embodiment of the present invention.
Figure 11B:
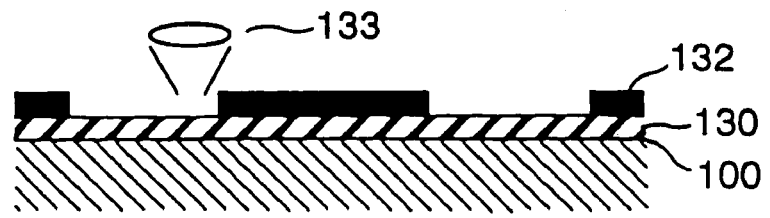
Figure 11C:
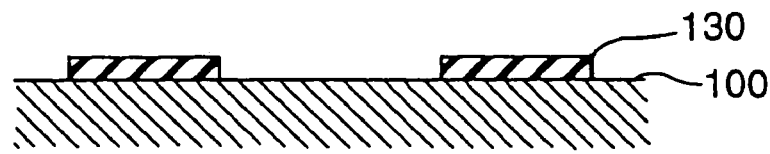
Figure 11D:
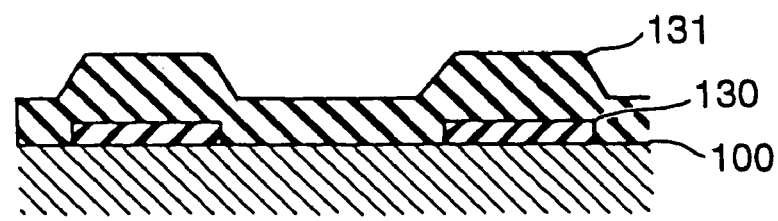
Figure 11E:
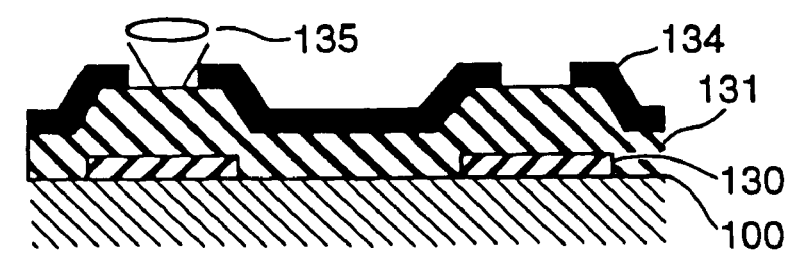
Figure 11F:
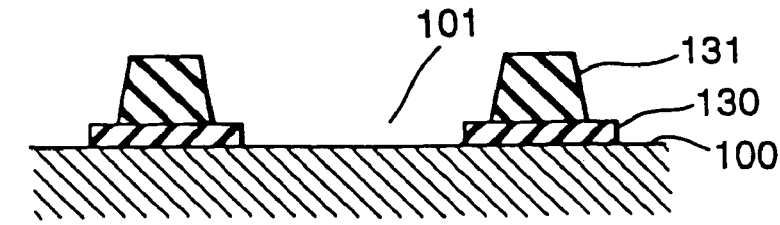
Figure 12A:
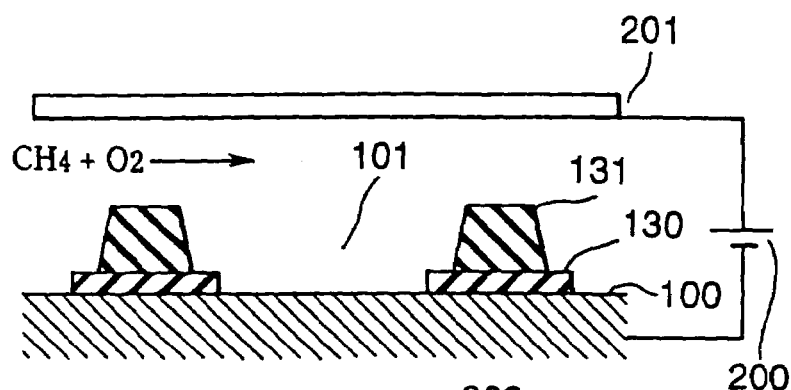
FIG. 12A-12C are cross-sections (continued) of manufacturing processes in a thin film formation process pertaining to the sixth embodiment of the present invention.
Figure 12B:
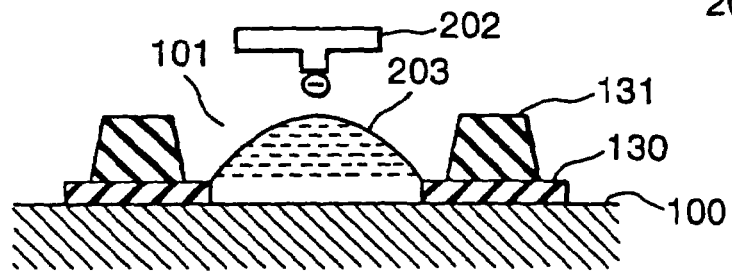
Figure 12C:
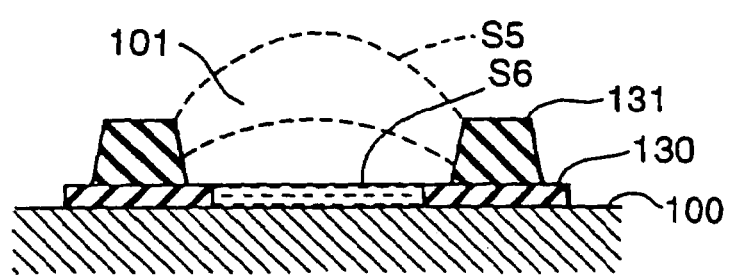

Whether a surface is readily wettable or practically unwettable by any fluid such as a liquid thin film material, that is, whether it exhibits affinity or non-affinity, can be found out by measuring the angle of contact subtended between the material surface and the fluid. In FIG. 9 is given a diagram of measurement plots showing how the angle of contact varies according to the mixture ratio between a fluorine-based compound and oxygen, in cases where organic and inorganic materials are subjected to a plasma treatment. For these measurements, the surfaces of substrates over the entire surface whereof were formed a polyimide, ITO, and $SiO_2$ were subjected to the plasma treatment described earlier, and the angles of contact with the inks described below were measured.

For the substrate whereon the polyimide film is formed, a PPV precursor ink (wherein a PPV precursor solution is diluted with a mixed solvent the main component whereof is DMF, to which a small amount of glycerin and diethylene glycol had been added) was used.

For the substrate whereon ITO or $SiO_2$ is formed, an ink was used made by adding methanol, glycerin, and ethoxy ethanol to a water dispersion of a hole injection material (polyethylene dioxythiophene to which a polystyrene-sulfonic acid was added).

The angle of contact is the angle of contact with an ink or the like which is a fluid exhibiting affinity. $CF_4$ is used here for the fluorine-based compound, a polyimide for the organic material, and $SiO_2$ and ITO (indium-tin oxide) for the inorganic material. As shown in FIG. 9, there is no great difference in degree in the angle of contact exhibited by an organic material and an inorganic material in an oxygen-excessive atmosphere. However, when the amount of fluorine-based compound is made excessive, the angle of contact of the organic material becomes larger (non-affinity is exhibited). Contrariwise, there is little change in the angle of contact of the inorganic material. When oxygen is contained in the reaction gas, polar groups are generated in both the inorganic material and the organic material due to the oxidizing action of the oxygen. When the amount of the fluorine-based compound is excessive, however, that fluorine-based compound will penetrate into the organic material, wherefore, it is believed, the effect of the polar groups is relatively lessened. Accordingly, by conducting the plasma treatment under controlled conditions wherewith the fluorine-based compound is excessive compared to oxygen, it is possible to impart to both the organic material and the inorganic material, respectively, the desired angles of contact (affinity) in accordance with FIG. 9. It is particularly desirable, in order to maximize the difference in angle of contact between the two, to use the best mixture ratio ($CF_4/(CF_4+O_2)=75\%$) in FIG. 9 or to introduce a mixture gas of $CF_4$ and He under atmospheric pressure.

In view of the facts stated above, either a reduced-pressure plasma treatment or atmospheric-pressure plasma treatment is conducted so that a fluorine-based compound is made the induction gas and oxygen is mixed therein in a certain proportion. As diagrammed in FIG. 8B, for example, with a capacity-coupled plasma treatment, the gas noted above is made to flow into the reaction chamber, a substrate having the bank formation surface 100 is loaded onto one electrode, and an electric field is applied between the other electrode 201 from a power supply 200. Also, if the conditions are selected for the angle of contact of the banks 110 such that the angle of contact at the extreme edges does not become large, a thin film layer 204 can be formed with a nearly uniform film thickness without being repelled by the extreme edges at the side walls of the banks 110. The quantity of the liquid thin film material 203 discharged is adjusted so that the thickness of the thin film layer 204 after formation becomes 0.1 µm to 2 µm or so.

The ink jet process used may be a piezo-jet process or a process that effects discharge by the generation of foam by heat. The piezo-jet process involves a configuration wherein a nozzle and a piezoelectric element are comprised in a pressure chamber. When a voltage is applied to a piezoelectric element loaded with a fluid in the pressure chamber, the pressure chamber undergoes a volumetric change, and fluid droplets are discharged from the nozzle. With the process that discharges by foam generation, a heating element is provided in the pressure chamber that communicates with a nozzle. Therewith, the heating element is made to emit heat, thereby vaporizing the fluid in the vicinity of the nozzle, thus generating foam, by the volumetric expansion whereof the fluid is discharged. The piezo-jet process is preferable in view of fact that therewith there is no degradation caused in the fluid by heating.

When this embodiment, as described in the foregoing, is implemented, plasma treatment is conducted under conditions wherein oxygen is mixed into a fluorine-based compound. Therefore, in one quick operation, surface treatment can be performed to effect non-affinity for the liquid thin film material in the bank surfaces and affinity therefor in the bank formation surface. In addition, the angles of contact can readily be set so as to exhibit degrees of affinity according to the characteristics plotted in FIG. 9. That is, the affinities of both the bank and the bank formation surface can be definitely controlled, while maintaining high bonding strength between the banks themselves and the bank formation surface, without having to negotiate numerous processes as required conventionally for affinity control. Thus the liquid thin film material can be prevented from overflowing the banks, product yield can be improved, and manufacturing costs can be reduced.

(5) Fifth Embodiment

A fifth embodiment of the present invention relates to a thin film formation method used when forming banks in a two-layer structure. This embodiment is particularly characterized by the fact that the lower layer is formed of an inorganic material and the upper layer is formed of an organic material.

Manufacturing process cross-sections for this embodiment are given in FIG. 10A-10F. This embodiment, as the fourth embodiment, can be employed in all kinds of applications wherein banks are provided in any desired shape on a bank formation surface, and areas partitioned by banks are filled with a prescribed fluid. It can be employed, for example, in cases where, in a display device wherein organic semiconductor thin film elements are used, pixel areas are filled with an organic semiconductor material, and in cases where, in a color filter, pixel areas are filled with colored resin.

Lower layer film formation process (FIG. 10A): The lower layer film formation process is a process for forming a lower layer film 120 on a bank formation surface 100. The bank formation surface is the same as in the fourth embodiment described above. It is desirable that the material of the lower layer film be composed of an inorganic material in order to obtain good non-affinity in a subsequent surface treatment. It is also desirable that this material exhibit good bonding strength with the bank formation surface 100. In cases where the bank formation surface is formed of ITO or the like, for example, it is possible to use ordinary silicon oxide ($SiO_2$), a silicon nitride film, or amorphous silicon. When such a material is used, affinity is obtained by plasma treatment that is between the affinity of the bottom surface of the depressions 101 and the affinity of the upper bank surfaces 121. This affinity is effective in causing the liquid thin film material to flatly and securely adhere to the bottom surface of the depressions 101. The lower layer film is formed by coating the inorganic material described above by a prescribed method such as spin coating, spray coating, roller coating, die coating, or dip coating, etc., adjusted to a desired height. It is preferable that the height of the lower layer film 120 be roughly the same as the height of the thin film layer 204. Because the lower layer film 120 exhibits some degree of affinity with the liquid thin film material 203, the liquid thin film material 203 and the wall surfaces of the lower layer film 120 will bond together when the liquid thin film material 203 is subjected to heat treatment. This is because, if the final thickness of the liquid thin film material 203 and the height of the lower layer film 120 are made roughly equal, the distortion in the surface of the thin film layer 204 induced by the bonding of the liquid thin film material 203 to the wall surface of the lower layer film 120 can be eliminated.

Upper layer formation process (FIG. 10B): The upper layer formation process is a process for forming the upper bank layer 121 on the lower layer film 120. The organic materials listed for the fourth embodiment described above are used for the material of the upper bank layer 121. It is also possible to make this do double duty as a shielding material. The upper bank layer 121 is selectively formed in areas where banks are to be formed. Any process can be selected, such as a printing process or lithographic process, etc. When a printing method is used, the organic material is coated directly in the bank shape, by any method, such as intaglio printing, planography, or relief printing. When a lithographic method is employed, the organic material is coated on, in conformity with the height of the upper bank layer 121, by a prescribed method such as spin coating, spray coating, roller coating, die coating, or dip coating, etc., and a resist layer is coated thereupon. By exposing and developing the resist with a mask applied in conformity with the shape of the banks, the resist is left remaining in conformity with the shape of the banks. Etching is performed last of all to remove the material of the upper bank layer that is not masked. The banks 110 are formed with a height wherewith the liquid thin film material will not overflow into adjacent depressions, due to surface tension, when the depressions 101 enclosed by the banks are filled with the liquid thin film material. If the thin film layer, after heat treatment, is formed with a thickness of 0.05 μm to 0.2 μm, for example, the matched heights of the lower layer film 120 and the upper bank layer 121 are formed at a height of 1 μm to 2 μm or so.

Removal process (FIG. 10C): The removal process is a process for etching the lower layer film using the upper bank layer 121 as a mask. The upper bank layer 121 is an organic material and can act as a resist . . . That being so, it is possible to selectively etch only the lower layer film 120 by selecting the etching material. For example, the upper bank layer 121 is formed beforehand to a thickness greater than the thickness sought, and the entirety of the lower layer film is dry-etched, or, when the lower layer film 120 is formed of $SiO_2$, wet etching is performed using hydrofluoric acid as the etching agent. In this process the lower layer film 120 is removed except in the bank formation areas masked by the upper bank layer 121.

Surface treatment process (FIG. 10D): The surface treatment process is a process wherein a plasma process is conducted under certain conditions to adjust the affinity of the bank formation surface 100, the lower layer film 120, and the upper bank layer 121 for the liquid thin film material. The plasma treatment in the present invention is performed under the same conditions and using the same gas as in the first embodying aspect described earlier. In particular, if ITO and $SiO_2$ are selected for the bank formation surface 100 and the lower layer film 120, respectively, good affinity setting can be performed by this surface treatment. That is, as is shown in FIG. 9, since ITO and $SiO_2$ are both inorganic materials, the variation characteristics arising from the mixture ratio between the fluorine-based compound and oxygen are similar, but $SiO_2$ exhibits a higher affinity trend. For this reason, surface treatment can be performed so that the order of affinity degree in the bank formation surface 100, lower layer film (lower bank layer) 120, and upper bank layer 121 becomes "bank formation surface≧lower bank layer surface>upper bank layer surface."

Thin film formation process (FIG. 10E, 10F): The thin film formation process is a process for forming a thin film layer by filling the depressions 101 enclosed by the lower bank layer 120 and the upper bank layer 121 with the liquid thin film material 203. The details of this process are the same as in the fourth embodiment described earlier. After the liquid thin film material 203 is deployed, the solvent component is vaporized in a heat treatment or the like to form the thin film layer 204.

As diagrammed in FIG. 10E, the liquid thin film material 203 is discharged from an ink jet recording head 202 into the depressions 101. The discharge quantity is adjusted to a quantity wherewith the desired thickness is obtained after the volume has been reduced by heat treatment. It is preferable, for the reason stated earlier, that this thickness be approximately the same as the thickness of the lower bank layer 120. Even when the liquid thin film material 203 is discharged in a large volume as compared to the thickness of the thin film layer 204, as diagrammed in FIG. 10E, the surface tension of the upper bank layer 121 acts so that the liquid thin film material 203 mounds up, when deployed, to the S3 position, without overriding the banks. Once the liquid thin film material has been deployed, a heat treatment or the like is performed to vaporize the solvent component. By this vaporization of the solvent component, the volume of the liquid thin film material 203 decreases, as diagrammed in FIG. 10F, whereupon the thin film layer 204 is formed with its thickness at S4 on the bottom surface of the depression 101, which thickness is on the same order as that of the lower bank layer 120. At this time, since the bottom of the depressions 101, which is the bank formation surface 100, has been surface-treated to exhibit affinity, the thin film layer 204 exhibits good wetting. The angle of contact of the lower bank layer 120 is smaller than that of the upper bank layer 121, moreover, whereupon it bonds with the liquid thin film material 203 with suitable affinity. For this reason, the liquid thin film material 203 is not repelled by the side walls of the lower bank layer 120. The lower bank layer 120 and the thin film layer 204 have nearly the same thickness, moreover, wherefore the liquid thin film material 203 is not pulled away to the side walls of the lower bank layer 120. For this reason, the thin film layer 204 is formed with a nearly uniform film thickness. The quantity of liquid thin film material 203 discharged is adjusted so that the thickness of the thin film layer 204 after formation becomes 0.1 μm to 2 μm or so.

By implementing this embodiment, as described in the foregoing, the affinities of the upper bank layer, lower bank layer, and bank formation surface can be set so as to rise, in that order, by conducting a plasma treatment under the condition that oxygen is mixed into the fluorine-based compound, in banks laminated of an inorganic material and an organic material. That is, it is possible to terminate the surface treatments at one time by controlling a simple plasma treatment, while maintaining high bonding strength between the banks themselves and the bank formation surface, without undergoing numerous processes as required conventionally for affinity control. Thus the liquid thin film material can be prevented from overflowing the banks, product yield can be improved, and manufacturing costs can be reduced. In particular, the benefit of being able to form uniform thin film layers is realized.

(6) Sixth Embodiment

A sixth embodiment of the present invention forms banks in a two-layer structure by a method differing from that of the fifth embodiment described above.

Manufacturing process cross-sections for this embodiment are diagrammed in FIG. 11A-11F and FIG. 12A-12C. This embodiment, as the fourth embodiment, can be employed in all kinds of applications wherein banks are provided in any desired shape on a bank formation surface, and areas partitioned by banks are filled with a prescribed fluid. It can be employed, for example, in cases where, in a display device wherein organic semiconductor thin film elements are used, pixel areas are filled with an organic semiconductor material, and in cases where, in a color filter, pixel areas are filled with colored resin. The materials for and thicknesses of the bank formation surface, lower layer film, and upper bank layer are the same as in the fourth and fifth embodiments described earlier, and so are not further described here.

Lower layer film formation process (FIG. 11A): The lower layer film formation process is a process for forming a lower layer film 130 on the bank formation surface 100. The lower layer film 130 is formed by the same method as in the fifth embodiment described earlier.

Exposure process (FIG. 11B): This exposure process is a process for exposing the lower layer film 130 matched to the shape of the banks. A mask 132 matched to the shape of the banks is deployed on the upper portion of the lower layer film 130. In cases where the lower layer film 130 is a material that is hardened by the application of energy, masking is done so that light passes through to the bank formation areas but not through to the areas to be removed. In cases where the lower layer film 130 is a material that is degraded so as to be removable by the application of energy, masking is done so that light is interrupted to the bank formation areas but passed through to the areas to be removed. It is possible to etch the lower layer and upper layer independently, wherefore the shapes of the banks in the lower layer and in the upper layer, respectively, can be made to differ. By suitably selecting the shape of the lower bank layer, it becomes possible to suitably deploy the thin film layer. Exposure is made using a known method such as one employing a laser beam or other energy source.

Etching process (FIG. 11C): This etching process is a process for removing the lower layer film 130 so as to leave the areas hardened by exposure. After the exposure is made, the mask and the areas to be removed in the lower layer film 130 are removed using a solvent. When $SiO_2$ or a polysilazane is used for the lower layer film 130, etching is performed using hydrofluoric acid as the etching agent. Dry etching may also be used.

Upper layer film formation process (FIG. 11D): The upper layer film formation process is a process for forming the upper layer film 130 so that it covers the lower bank layer 130. The upper layer film 131 is formed by the same process as the lower layer film 130, described above.

Exposure process (FIG. 11E): This exposure process is a process for exposing the upper layer film 131 in conformity with the shape of the upper layer banks. A mask 134 is deployed on the upper layer film 131 so as to match the shape of the upper bank layer. In cases where the upper layer film 131 is a material that is hardened by the application of energy, masking is done so that light passes through to the bank formation areas but not through to the areas to be removed. In cases where the upper layer film 131 is a material that is degraded so as to be removable by the application of energy, masking is done so that light is interrupted to the bank formation areas but passed through to the areas to be removed. In this embodiment, as described in the foregoing, the shape of the upper bank layer 131 may be made to differ from that of the lower layer. Exposure may be made using a known method such as one employing a laser beam or other energy source.

Etching process (FIG. 11F): This etching process is a process for removing the upper layer film 131 so as to leave the areas hardened by exposure. After the exposure is made, the mask and the areas to be removed in the upper layer film 131 are removed using a solvent. When a polyimide is used for the upper layer film 131, etching is performed using hydrofluoric acid as the etching agent. Dry etching may also be used.

Surface treatment process (FIG. 12A): The surface treatment process is the same as in the fifth embodiment, described earlier, wherefore no further description thereof is given here. With this surface treatment, surface treatment can be performed so that the order of affinity degree in the bank formation surface 100, lower layer film 130, and upper bank layer 131 becomes "bank formation surface≧lower bank layer surface>upper bank layer surface."

Thin film formation process (FIG. 12B, 12C): The thin film formation process is a process for forming a thin film layer by filling the depressions 101 enclosed by the lower bank layer 130 and the upper layer 131 with the liquid thin film material 203. This thin film formation process is the same as in the fifth embodiment, described earlier, wherefore no further description thereof is given here.

By implementing this embodiment, as described in the foregoing, the affinities of the upper bank layer, lower bank layer, and bank formation surface can be set so as to rise, in that order, by conducting a plasma treatment under the condition that oxygen is mixed into the fluorine-based compound, in banks laminated of an inorganic material and an organic material. That is, it is possible to terminate the surface treatments at one time by controlling a simple plasma treatment, while maintaining high bonding strength between the banks themselves and the bank formation surface, without undergoing numerous processes as required conventionally for affinity control. Thus the liquid thin film material can be prevented from overflowing the banks, product yield can be improved, and manufacturing costs can be reduced. In particular, the benefits of being able both to form uniform thin film layers and to form the lower bank layer and upper bank layer in differing shapes are realized.

(7) Seventh Embodiment

A seventh embodiment relates to a display device that is manufactured by applying the fifth embodiment described earlier to an actual display device.

(Overall Configuration)

Figure 13:
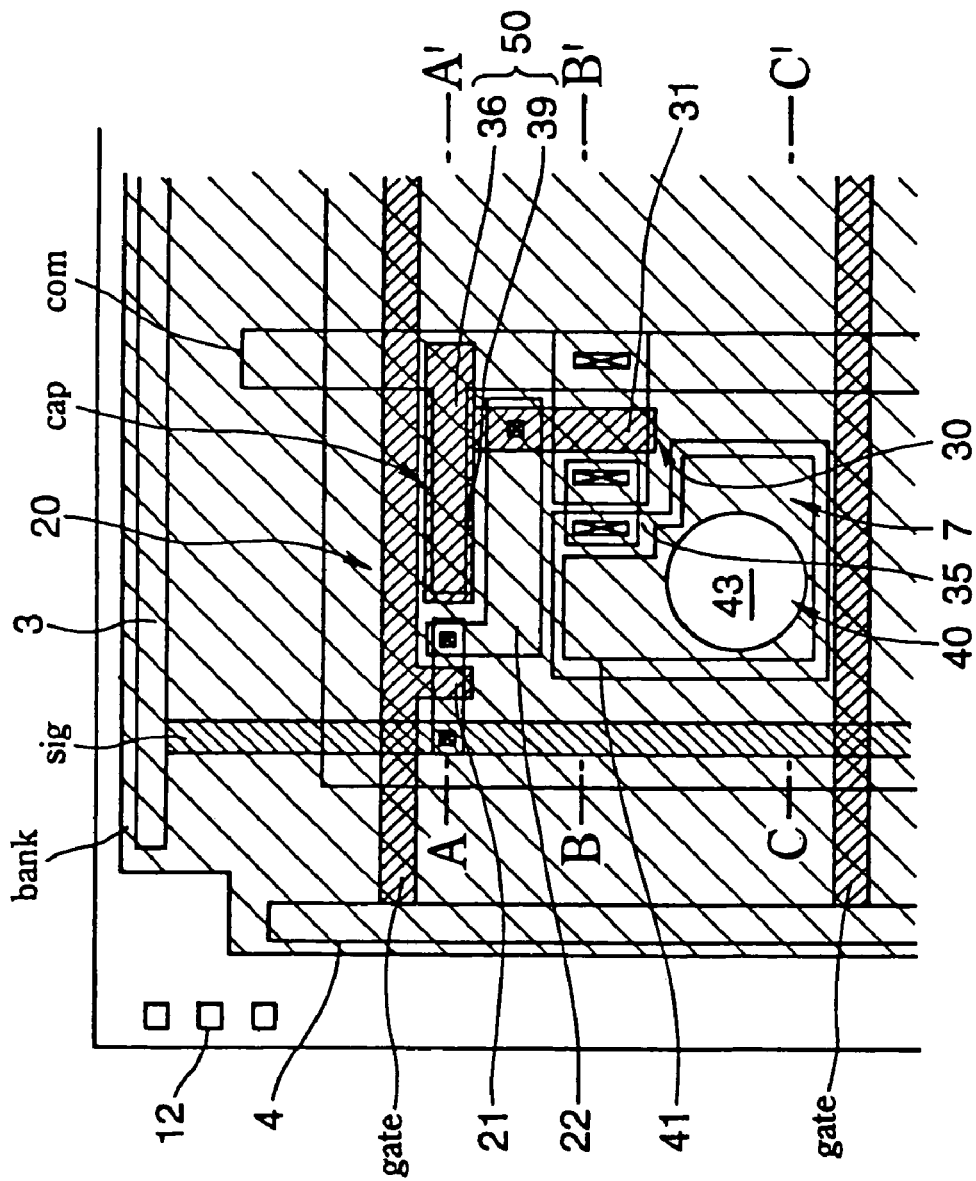
FIG. 13 is a plan representing one extracted pixel comprised in an active-matrix type display device pertaining to a seventh embodiment of the present invention.
Figure 14A:
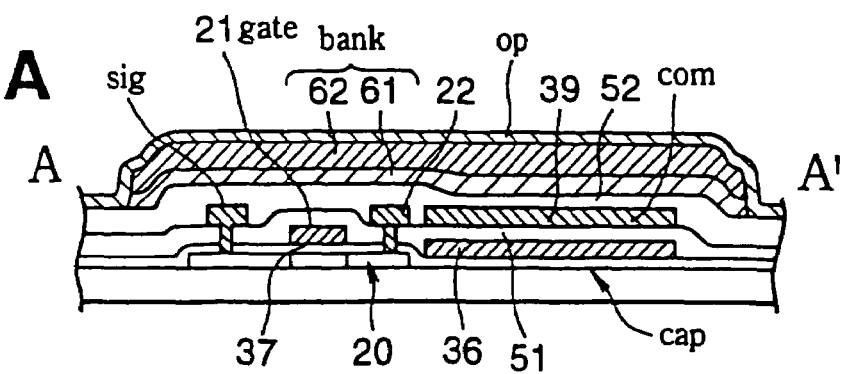
FIG. 14A-14C are cross-sections in the A-A' plane, B-B' plane, and C-C' plane, respectively, in FIG. 13.
Figure 14B:
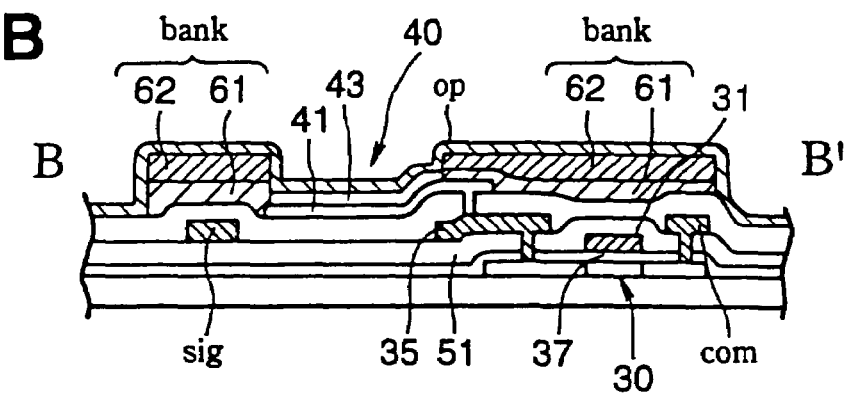
Figure 14C:
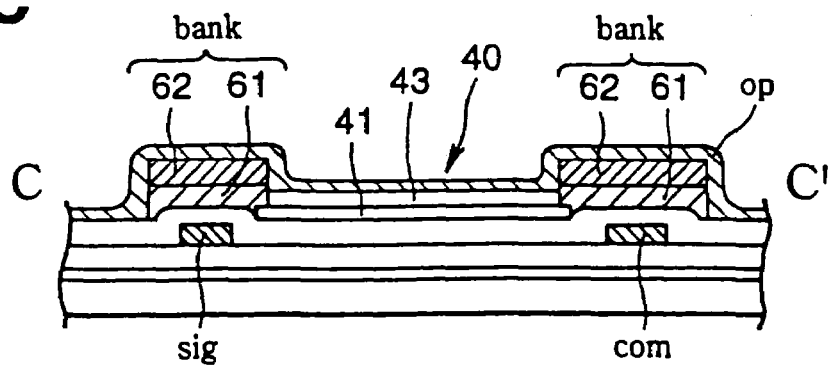
Figure 15A:
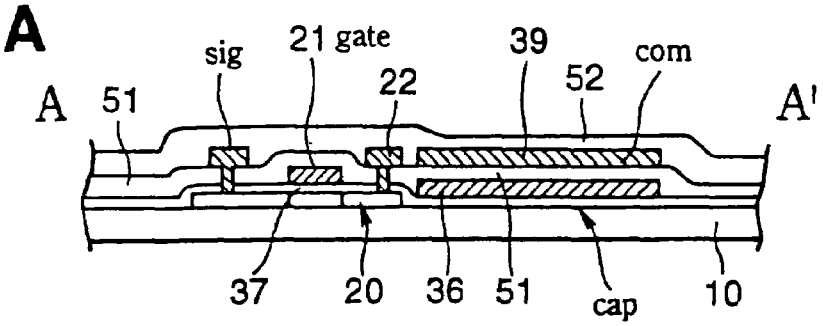
FIG. 15A-15C are cross-sections in the A-A' plane, B-B' plane, and C-C' plane, respectively, in FIG. 13, for describing a semiconductor layer formation process.
Figure 15B:
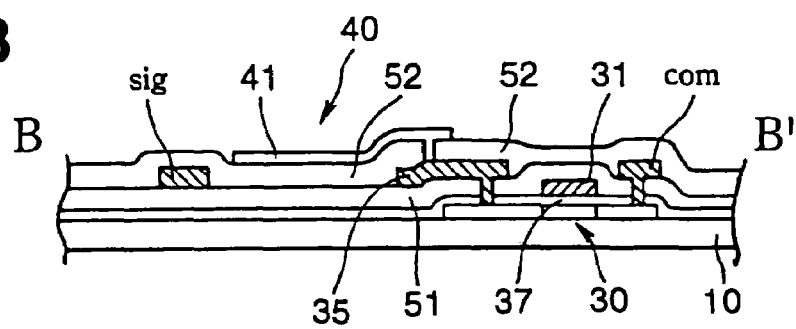
Figure 15C:
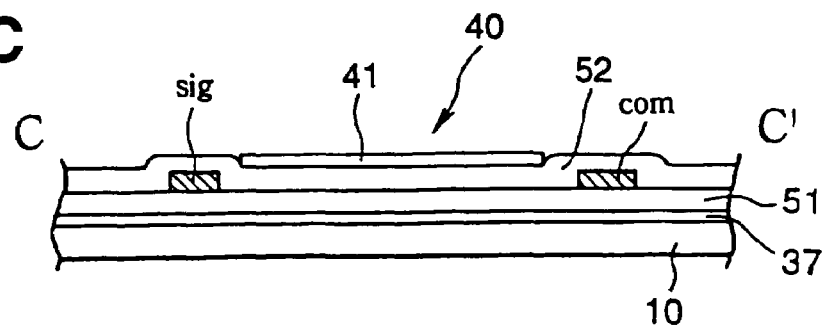

This display device is an active-matrix type display device, the overall configuration whereof is the same as that diagrammed in FIG. 3 described earlier. (For this reason, the same symbols are used for the configuring elements as in FIG. 3, and no further description is given here of coinciding components.) FIG. 13 is a plan representing one extracted pixel comprised therein, and FIG. 14A-14C are cross-sections in the A-A' plane, B-B' plane, and C-C' plane, respectively, in FIG. 13.

The overall configuration of this active-matrix type display device 1 is the same as or equivalent to that diagrammed in FIG. 3, described earlier. The points of difference are as follows.

Each of the pixels 7 is formed as a depression enclosed by a bank layer BANK. This bank layer is configured in laminar fashion with a lower layer side insulating film 61 and an upper layer side insulating film 62. A third embodying aspect is employed in the application of this bank layer BANK. The material and height thereof, etc., are the same as in the third embodying aspect. An organic semiconductor material is used as the liquid thin film material. The organic semiconductor film 43 is formed by discharging this material into the areas enclosed by the bank layer BANK and then heating it. If [the thickness of] this organic semiconductor film 43 is 0.05 μm to 0.2 μm, the lower layer side insulating film 61 and the upper layer side insulating film 62 are formed so that [their thicknesses] become approximately 0.2 μm to 1.0 μm, and 1 μm to 2 μm, respectively.

The first TFT 20 and the second TFT 30 are formed by island-shaped semiconductor films as diagrammed in FIGS. 7 and 8. For the organic semiconductor film 43, a material that emits light with the application of an electric field, such as a polyphenylene vinylene (PPV), for example, is used.

(Bank Layer Action)

With the configuration described above, the bank layer BANK is subjected to a plasma treatment using fluorine or a fluorine-based compound as the induction gas, as in the embodiment aspects described earlier, prior to deploying the organic semiconductor material 203 in an ink jet process. For this reason, affinity for the organic semiconductor material is formed in the order pixel electrode 41≧lower layer side insulating film layer 62>upper layer side insulating film layer 62. For this reason, even if the pixel areas enclosed by the bank layer BANK are filled up completely with the liquid thin film material containing the organic semiconductor material, the organic semiconductor film 43 will settle at the height of the lower layer side insulating layer 62, the organic semiconductor film 43 can be prevented from hardening in a U-shape, and a flat organic semiconductor film 43 can be formed. When some portion of the organic semiconductor film 43 has a thin film thickness, the drive current of the thin film light emitting element 40 will be concentrated there, and the reliability of the thin film light emitting element 40 will decline, but such problems can be eliminated.

In this embodiment, furthermore, the bank layer BANK is also formed in areas, within the area where the pixel electrode 41 is formed, which overlap the relay electrode 35 of the conductivity control circuit 50, and the organic semiconductor film 43 is not formed in areas which overlap the relay electrode 35. That is, the organic semiconductor film 43 is only formed in the flat portions of the area where the pixel electrode 41 is formed. This is also a factor in maintaining the organic semiconductor film 43 at a certain film thickness.

If there is no bank layer BANK in the areas overlapping the relay electrode 35, in that portion also the drive current will flow between the opposing electrode OP, and the organic semiconductor film 43 will emit light. However, this light will be trapped between the relay electrode 35 and the opposing electrode OP so that it is not emitted to the outside and does not contribute to the display. Such a drive current that flows in a portion that does not contribute to the display may be termed ineffective current in terms of the display. Hence, in this aspect, the bank layer BANK is formed in portions where conventionally such ineffective current should flow. Nevertheless, wasted current can be prevented from flowing to the common power supply line COM, whereupon the width of the common power supply line COM can be made that much narrower. As a result, the light emitting surface area can be increased, and such display performance parameters as brightness and contrast ratio can be improved.

It is also possible to form organic semiconductor films that are deployed separately for each primary color, employing an ink jet process, wherefore patterning is possible without employing a complicated process such as a photolithographic process.

The bank layer BANK may also be formed by a black resist. The bank layer BANK thereupon functions as a black matrix, and such display qualities as contrast ratio are improved. More specifically, with the active-matrix type display device 1 to which this aspect pertains, the opposing electrode OP is formed over the entire surface of the pixel 7 on the front side of the transparent substrate 10, wherefore the light reflected by the opposing electrode OP causes the contrast ratio to decline. That notwithstanding, if a bank layer BANK which functions also to reduce parasitic capacitance is configured by a black resist, that bank layer BANK can be made to function as a black matrix, and to block the reflected light from the opposing electrode OP, wherefore the contrast ratio can be improved.

The bank layer BANK is formed along the data line SIG and the scanning lines GATE, thicker than the organic semiconductor film 43, and thereon is formed the opposing electrode OP. Therefore, due to the presence of the bank layer BANK, large capacitances can be prevented from becoming parasitic on the data line SIG. That is, because the thick bank layer BANK is also interposed between the data line SIG and the opposing electrode OP, the parasitic capacitance produced in the data line SIG is extremely small. Because of that fact, the loads on the drive circuits 3 and 4 can be reduced, and it becomes possible to effect low power consumption operation and/or faster display operations.

The bank layer BANK, furthermore, is configured in a two-layer structure comprising an inorganic material and an organic material. If an attempt is made to form a thick bank layer of only an inorganic material, it becomes necessary to form the film from the inorganic material by a PECVD process or the like, which requires a long process time. In contrast thereto, it is easy to form a comparatively thick film of an organic material in a resist or polyimide layer. The bank layer BANK in this embodying aspect is constituted of an organic material wherewith it is easy to make the upper layer side insulating film 62 a thick film. Hence the bank layer formation can be concluded in a short time and productivity thus enhanced.

If such a two-layer structure is effected, moreover, the organic semiconductor film 43 comes in contact with the lower layer side insulating film made of the inorganic material, but it does not come in contact with the upper layer side insulating film 62 made of the organic material. Because of that, the organic semiconductor film 43 will not deteriorate under the influence of the upper layer side insulating film 62 configured of the organic material, wherefore, in the thin film light emitting element 40, there is no decline in either light emitting efficiency or reliability.

As based on this embodiment, the bank layer BANK is formed also in the peripheral areas of the transparent substrate 10 (that is, in areas exterior to the display unit 11), wherefore both the data side drive circuit 3 and the scanning side drive circuit 4 are covered by the bank layer BANK. It is sufficient that the opposing electrode OP be formed at least in the display unit 11, with no necessity of forming it all the way to the drive circuit areas. However, when the opposing electrode OP is formed using a mask-sputtering process, matching precision is poor, wherefore the opposing electrode OP is sometimes formed all the way to the drive circuit areas. In this embodiment, even should the opposing electrode OP be formed all the way to the drive circuit areas, the bank layer BANK will be interposed between the drive circuit interconnection layer and the opposing electrode OP. Hence capacitances can be prevented from becoming parasitic in the drive circuits 3 and 4, the loads on those drive circuits 3 and 4 can be reduced, and it is possible to effect lower poser consumption and/or faster display operation.

(Display Device Operation)

In the active-matrix type display device 1 configured as described in the foregoing, when the first TFT 20 is selected and turned on by a scanning signal, an image signal from the data line SIG is applied to the gate electrode 31 of the second TFT 30 via the first TFT 20. At the same time, the image signal will be written to the holding capacitor CAP via the first TFT 20. As a result, when the second TFT 30 is turned on, a voltage is applied, with the opposing electrode OP and the pixel electrode 41 serving as the negative electrode and positive electrode, respectively, whereupon, in the area where the applied voltage exceeds the threshold voltage value, the current flowing to the organic semiconductor film 43 (the drive current) will increase very rapidly. Accordingly, the light emitting element 40 emits light as an electro-luminescence device or LED device. The light from the light emitting element 40 is reflected by the opposing electrode OP, passed through the transparent pixel electrode 41 and the transparent substrate 10, and ejected. The drive current for effecting this light emission flows through a current path configured by the opposing electrode OP, the organic semiconductor film 43, the pixel electrode 41, the second TFT 30, and the common power supply line COM, and will therefore cease flowing when the second TFT 30 is turned off. However, because the gate electrode of the second TFT 30 is maintained at an electrical potential corresponding to the pixel signal by the holding capacitor CAP, even when the first TFT 20 is turned off, the second TFT 30 remains in the on state. Hence the drive current will continue flowing to the light emitting element 40, and this pixel will remain in the lighted state. This state is maintained until new image data are written to the holding capacitor CAP and the second TFT 30 is turned off.

(Display Device Manufacturing Method)

Next, a method for manufacturing the active-matrix type display device configured as described in the foregoing is described while referencing FIG. 15A-15C to FIG. 20A-20C. This manufacturing method employs the manufacturing method of the fifth embodiment for the display device.

Semiconductor layer formation process (FIG. 15A-15C): First, after forming an underlayer protection film (not shown) consisting of a silicon oxide film having a thickness of approximately 2000 to 5000 Ångstroms in a plasma CVD process using TEOS (tetraethoxy silane) or oxygen gas, etc., as the raw material gas, as necessary, on the transparent substrate 10, a semiconductor film consisting of an amorphous silicon film having a thickness of approximately 300 to 700 Ångstroms is formed in a plasma CVD process on the back side of the underlayer protection film. Next, the semiconductor film consisting of the amorphous silicon film is subjected to a crystallization process such as laser annealing or a solid phase growing process, thereby crystallizing the semiconductor film to a polysilicon film. Next, the semiconductor film is patterned to yield an island-shaped semiconductor film, on the surface whereof is then formed a gate insulating film 37 consisting of a silicon oxide or nitride film having a thickness of approximately 600 to 1500 Ångstroms in a plasma CVD process using TEOS (tetraethoxy silane) or oxygen gas, etc. Next, after forming an electrically conductive film consisting of a film of metal such as aluminum, tantalum, molybdenum, titanium, or tungsten, by a sputtering process, patterning is performed to form the gate electrodes 21 and 31 and the extension 36 of the gate electrode 31. The scanning line GATE is also formed in this process.

In this condition, highly concentrated phosphorous ions are implanted to form source-drain regions in self-matching fashion with the gate electrodes 21 and 31. The portions into which impurities are not introduced become channel regions. Next, after forming the first interlayer insulating film 51, the contact holes are formed, and the data lines SIG, drain electrode 22, common power supply line COM, extension 39 of the common power supply line COM, and the relay electrode 35 are formed. As a result, the first TFT 20, second TFT 30, and holding capacitor CAP are formed.

Next, the second interlayer insulating film 52 is formed and a contact hole is formed in this interlayer insulating film in the portion corresponding to the relay electrode 35. Next, after forming an ITO film over the entire surface of the second interlayer insulating film 52, patterning is performed, and a pixel electrode 41 is formed, for each pixel 7, electrically connected to the source-drain region in the second TFT 30 via the contact hole.

Figure 16A:
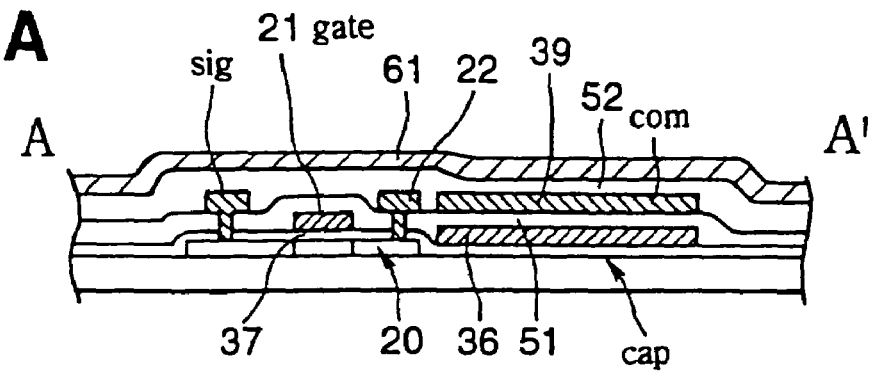
FIG. 16A-16C are cross-sections in the A-A' plane, B-B' plane, and C-C' plane, respectively, in FIG. 13; for describing a lower layer side insulating layer formation process.
Figure 16B:
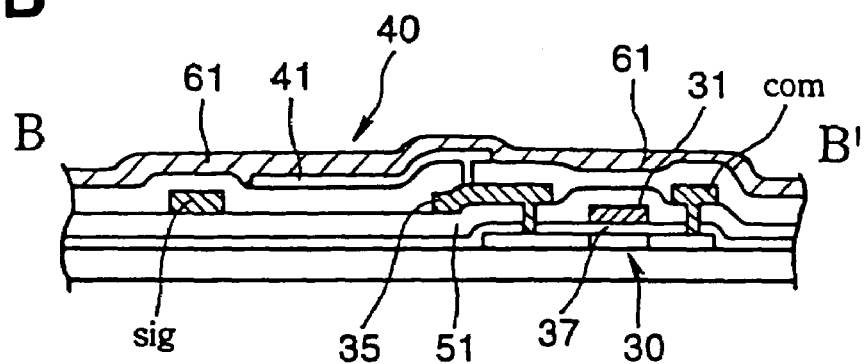
Figure 16C:
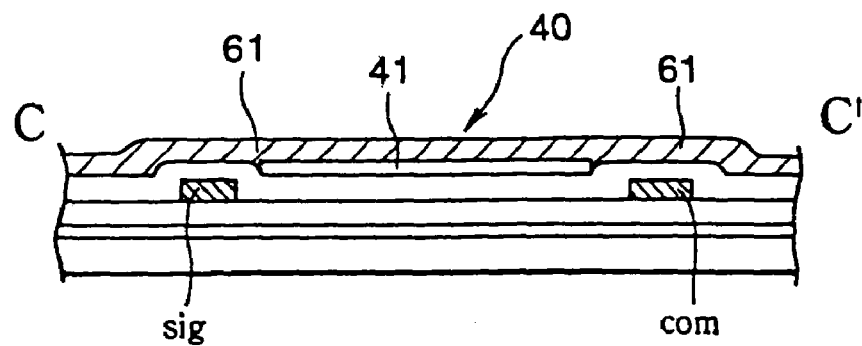

Lower layer side insulating film formation process (FIG. 16A-16C): Next, a film (an inorganic film for forming the lower layer side insulating film 61) consisting of an inorganic material is formed in a PECVD process or the like on the front surface of the second interlayer insulating film 52. This film is formed of the inorganic material and to the thickness described in the embodying aspect described earlier. This film is formed to a thickness that is greater than the thickness of the organic semiconductor film 43. If the organic semiconductor film 41 is formed to a thickness of 0.05 µm to 0.2 µm, for example, the film of inorganic material is formed to a thickness of approximately 0.2 µm to 1.0 µm.

Figure 17A:
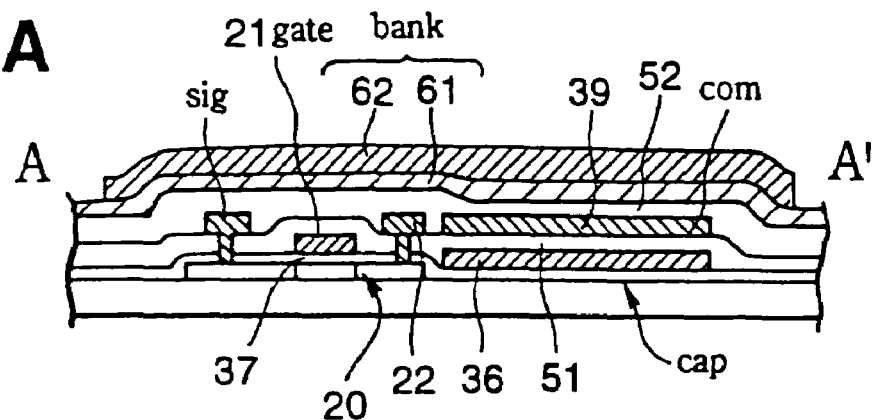
FIG. 17A-17C are cross-sections in the A-A' plane, B-B' plane, and C-C' plane, respectively, in FIG. 13; for describing an upper layer side insulating layer formation process.
Figure 17B:
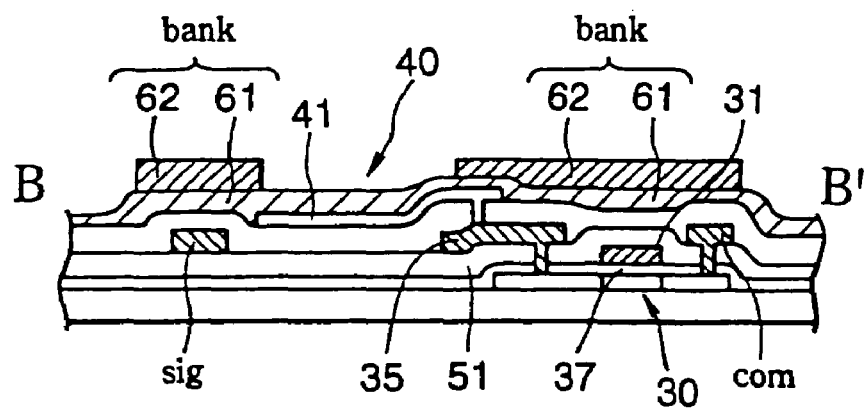
Figure 17C:
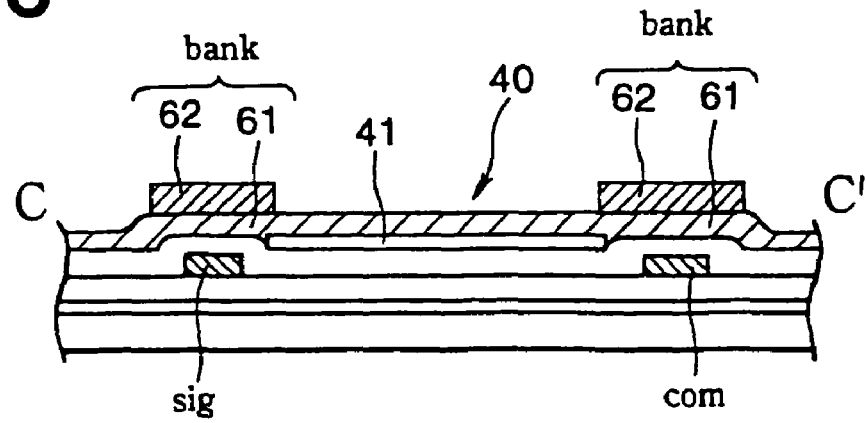

Upper layer side insulating film formation process (FIG. 17A-17C): A resist (upper layer side insulating film 62) is then formed along the scanning line GATE and the data line SIG. This upper layer side insulating film 62 is configured of the organic material of the embodying aspect described earlier. The thickness of the upper layer side insulating film 62 is formed to a height wherewith it can become a bulwark of such extent that the liquid thin film material will not overflow into the adjacent pixel areas even when the pixel area is filled with the liquid thin film material. If the organic semiconductor film 43 is formed to a thickness of 0.05 µm to 0.2 µm, or example, the upper layer side insulating film 62 is formed to a height of 1 µm to 2 µm or so.

Figure 18A:
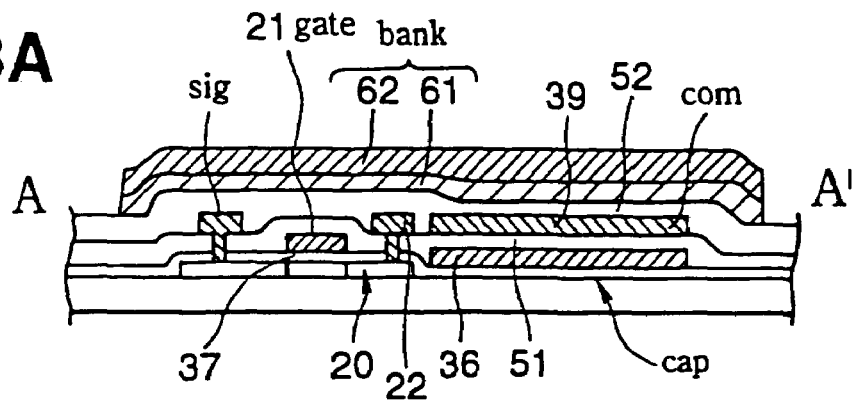
FIG. 18A-18C are cross-sections in the A-A' plane, B-B' plane, and C-C' plane, respectively, in FIG. 13; for describing a bank layer formation process.
Figure 18B:
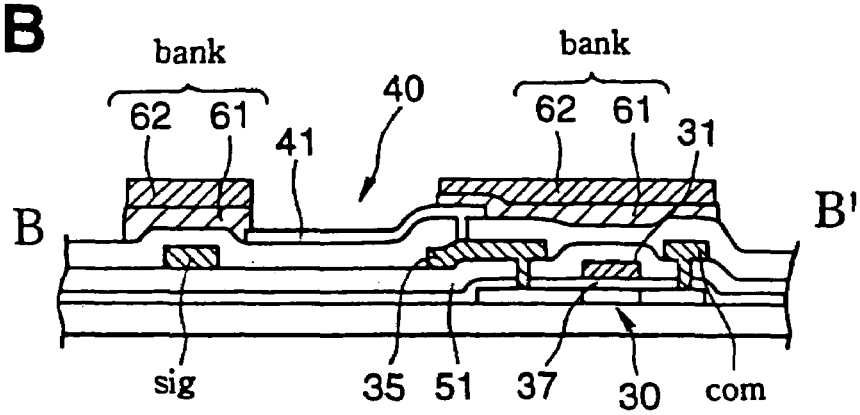
Figure 18C:
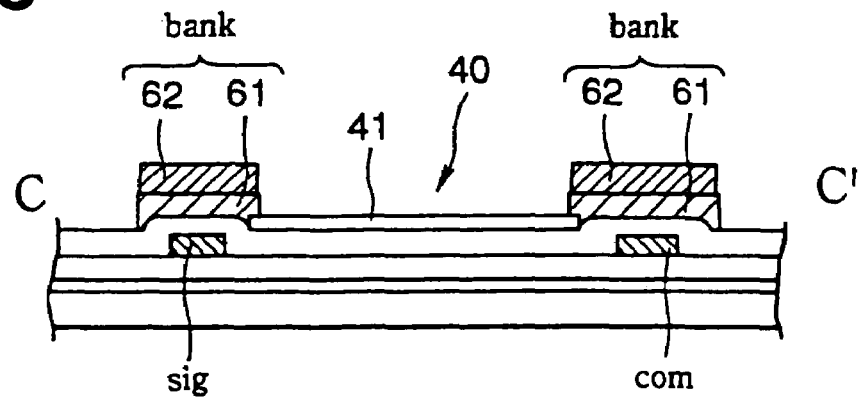
Figure 20A:
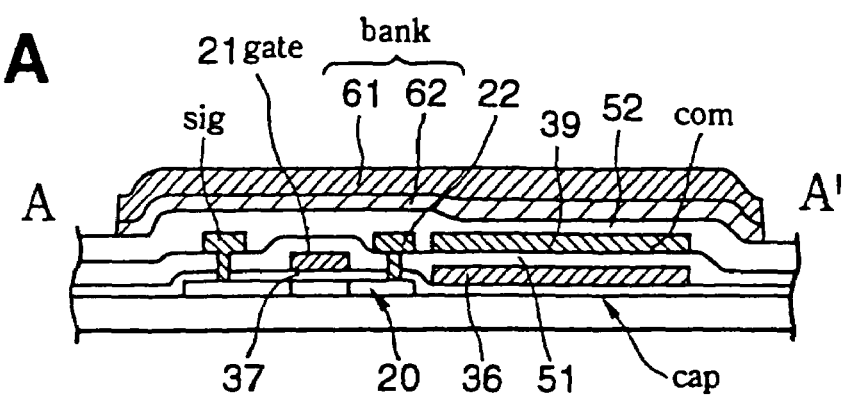
FIG. 20A-20C are cross-sections in the A-A' plane, B-B' plane, and C-C' plane, respectively, in FIG. 13; for describing an organic semiconductor film formation process.
Figure 20B:
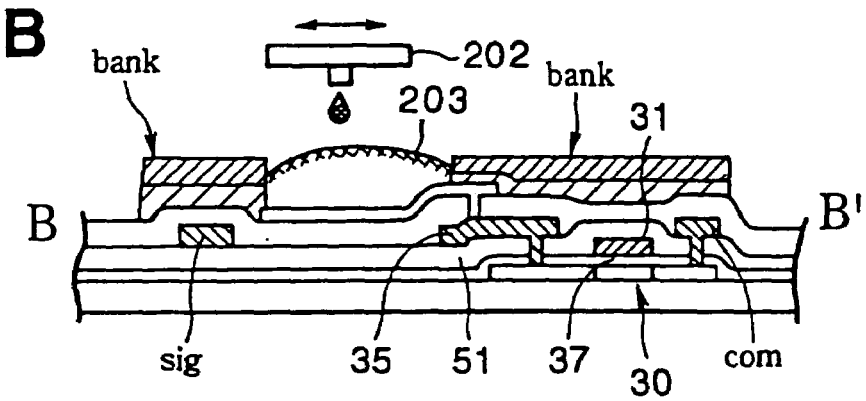
Figure 20C:
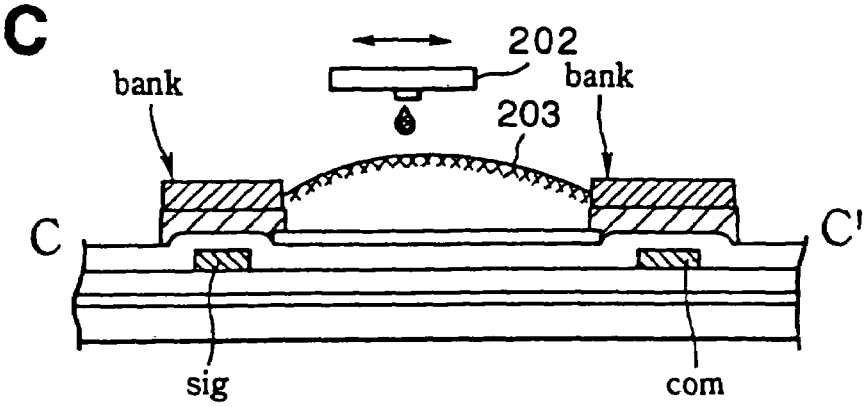

Removal process (FIG. 18A-18C): Next, the upper layer side insulating film 62 is masked and the layer consisting of the inorganic material is patterned. As a result, the film consisting of the inorganic material remains along the scanning like GATE and the data line SIG, and the lower layer side insulating film 61 is formed. Thus the bank layer BANK is formed in a two-layer structure comprising a lower layer side insulating film 61 and an upper layer side insulating film 62. At this time, the portion of the resist remaining along the data line SIG is made wide so as to cover the common power supply line COM. As a result, the area where the organic semiconductor film 43 of the light emitting element 40 is to be formed is enclosed by the bank layer BANK.

Surface treatment process (FIG. 19A-19C): Next, a plasma process is administered, using fluorine, to impart affinity for the liquid thin film material (or a hydrophilic property when the liquid thin film material contains water) to the surface of the pixel electrode 41, non-affinity for the liquid thin film material to the upper layer side insulating film 62, and an affinity therebetween to the lower layer side insulating film 61. The specific method used is the same as in the fourth and fifth embodiments.

Thereby, surface treatment is performed so that the order of affinity degree in the lower layer side insulating film 61 (inorganic material) and the upper layer side insulating film 62 (organic material) becomes "pixel electrode surface≧lower layer side insulating film surface>upper layer side insulating film surface."

Organic semiconductor film formation process (FIG. 20A-20C): As soon as the surface treatment described above is finished, organic semiconductor films 43 corresponding to R, G, and B are formed in an ink jet process in the areas demarcated in matrix-fashion by the bank layer BANK. In this operation, the liquid thin film material 203 that is the liquid material (precursor/discharge liquid) for configuring the organic semiconductor layers 43 is discharged from the ink jet recording head 202 onto the areas on the inside of the bank layers BANK. Next, a heat treatment is administered at a temperature of 100° C. to 150° C. to vaporize the solvent component in the liquid thin film material and form the organic semiconductor films 43 securely in the areas inside the bank layers BANK. These bank layers BANK have been surface-treated as noted above and therefore exhibit water repellency. For the liquid thin film material of the organic semiconductor film 43, that is the precursor of the organic semiconductor film 43, on the other hand, a hydrophilic solvent is used, wherefore the areas coated by the organic semiconductor films 43 are definitely defined by the bank layer BANK, and there is no overflow into the adjacent pixels 7. In addition, because the side walls of the bank layer BANK are water-repellent, the liquid thin film material will not adhere to the side walls, even when the solvent component of the liquid thin film material is vaporized by heat treatment so that the volume of the liquid thin film material decreases, and the contact surface between the liquid thin film material and the side walls will move to the pixel electrode 41 and the inorganic material areas which are more hydrophilic. Accordingly, in the organic semiconductor films 43 formed after the heat treatment, uniform thickness will be maintained on the pixel electrode, without thickening at the periphery. In cases where a multi-layer structure element is formed, moreover, it is only necessary to repeat the processes of liquid thin film material deployment, by the ink jet process, and of drying, for each layer. This would be a case where, for example, a light emitting film, hole injection layer, and electron injection layer are formed in laminar fashion for the organic semiconductor layer.

In the process described above, furthermore, a hole carrier layer may also be formed by an ink jet method. A liquid thin film material from which the hole carrier layer will originate can be deployed in pixel areas enclosed by a bank layer to a thickness of 3 μm to 4 μm, for example. When this liquid thin film material is heat-treated, a hole carrier layer having a thickness of 0.05 μm to 0.1 μm or so can be formed. Once this hole carrier layer is formed, the organic semiconductor material is deployed to a similar thickness in another ink jet process.

Once the organic semiconductor layers 43 are formed, the opposing electrode OP is formed over roughly the entire surface of the transparent substrate 10 and the active-matrix type display device 1 is complete (cf. FIG. 14A-14C).

By implementing a manufacturing method such as described in the foregoing, each of the organic semiconductor film 43 corresponding to R, G, and B can be formed in prescribed areas using an ink jet process, wherefore the full-color active-matrix type display device 1 can be manufactured with high productive yield. The organic semiconductor layers can be formed with uniform thickness, moreover, wherefore brightness irregularities do not occur. Also, because the thickness of the organic reflecting layer films is uniform, the drive current will not be concentrated in one portion of the thin film light emitting element 40, wherefore the reliability of the thin film light emitting element 40 can be prevented from declining.

Furthermore, although TFTs are formed in the data side drive circuit 3 and the scanning side drive circuit 4 diagrammed in FIG. 13, this is done by invoking the process of forming the TFTs in the pixels 7, in whole or in part. For that reason, the TFTs that configure the drive circuits will be formed between the same layers as the TFTs of the pixels 7. The first TFT 20 and the second TFT 30, moreover, may both be N types or both P types, or one may be an N type and the other a P type. With any of these combinations, however, the TFTs can be formed by a known process, wherefore no further description thereof is given here.

(Other Modification Examples)

The inventions are not limited to or by the fourth to seventh embodiments, but can be applied in various modifications within the scope of the essential invention.

Figure 21:
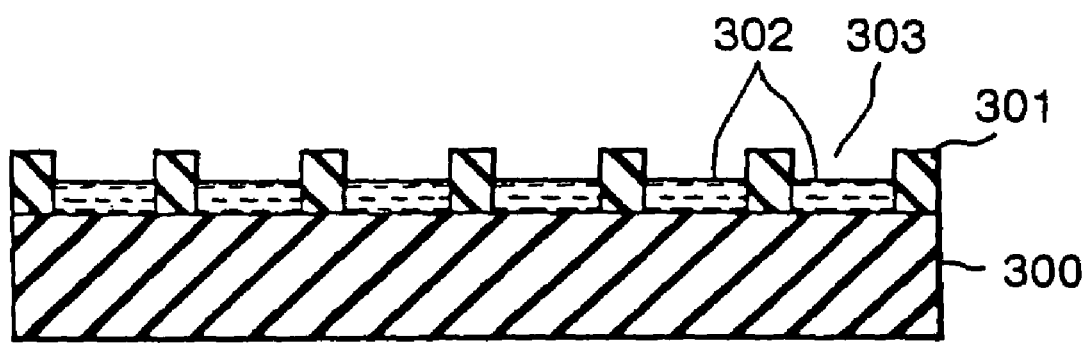
FIG. 21 is a cross-section of a color filter in an application of the present invention.

The seventh embodiment herein, for example, is an application of the present invention to a display device, but it may also be applied to a color filter as diagrammed in FIG. 21. In that case, a transparent substrate 300 consisting of glass or quartz is used for the bank formation surface, partitioning members 301 formed of a black material such as a resin are used for the banks, and a colored resin 302 is used or the liquid thin film material. The partitioning members 301 may be formed as a black matrix wherein a black pigment or dye, or a chromium oxide or chromium metal film, etc., is employed. After forming the partitioning members 301 on the transparent substrate 300, an ink jet process is used to fill depressions 303 enclosed by the partitioning members 301 with the colored resin 302. This invention can also be employed in other applications so long as it is a manufacturing method wherein depressions enclosed by partition-shaped members are filled with a fluid, which fluid may be any fluid.

The surface treatment, moreover, is not limited to a plasma treatment, but any surface treatment method can be employed so long as therewith different affinities can be processed under the same surface treatment conditions, as graphed in FIG. 9. That is because the main concept in this invention is that of being able to set a plurality of affinities at one time in one surface process. Accordingly, the materials for which affinities are set are not limited to an inorganic material and an organic material, and this invention can be applied to surface treatments between any specific materials so long as the affinity characteristics graphed in FIG. 9 are exhibited between those specific materials.

As based on the fourth to seventh embodiments and modification examples thereof, as set forth in the foregoing, plasma treatments are administered under certain conditions, it is possible to definitely control the affinities in banks and bank formation surfaces, while maintaining high bonding strength in the banks themselves for the bank formation surfaces, without involving numerous process steps to effect affinity control. Thus product yield can be raised and manufacturing costs reduced.

As based on the display devices [of the present invention], furthermore, the affinities of the banks and the bank formation surfaces are definitely set by administering plasma treatments under certain conditions, wherefore display devices can be provided which have thin films of uniform thickness, and wherewith a liquid thin film material can be prevented from overflowing the banks. Thus image displays can be made wherein there are no irregularities in brightness or color, and the reliability of those display devices can be enhanced.

If the liquid thin film material filling is done with an ink jet process, moreover, thin film layers can be selectively deployed in accord with color differences, thereby affording the benefit of implementing patterning with fewer process steps than photolithographic methods and the like.

The invention is next described in eighth to 11th embodiments, making reference to the drawings.

(8) Eighth Embodiment

A surface modification method relating to a first aspect of [this] embodiment of the present invention is now described using the drawings.

Figure 22:
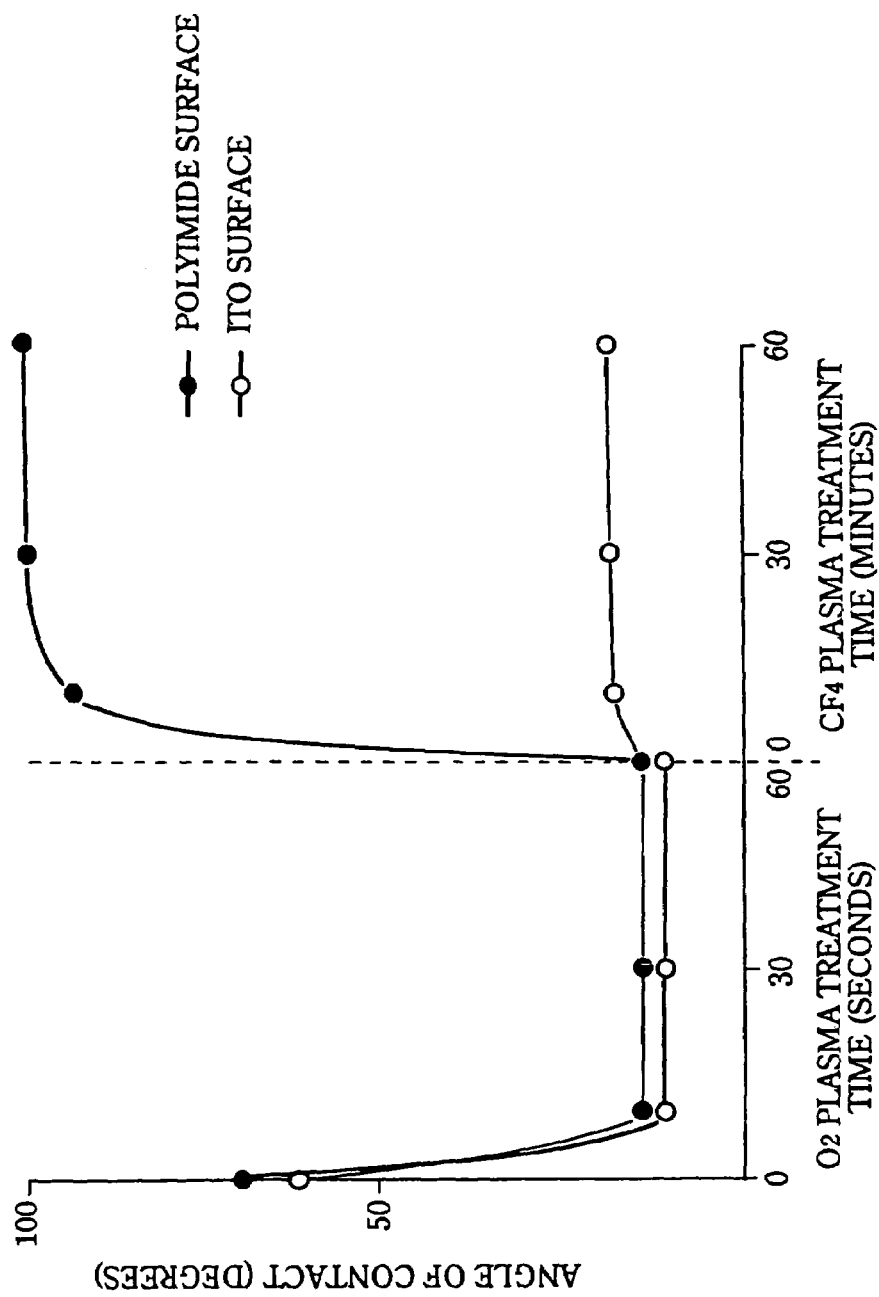
FIG. 22 is a diagram representing changes in the angle of contact on a polyimide film surface and ITO substrate surface induced by a plasma treatment pertaining to an eighth embodiment of the present invention.

In FIG. 22 are plotted changes in angles of contact on a polyimide film surface and on a water-based ink (having a surface tension of 30 mN/m) ITO substrate surface, in a case where plasma treatments are conducted consecutively using an oxygen plasma and $CF_4$ plasma. For the measurements here, the surfaces of substrates whereon a polyimide and ITO were formed, over the entire surface, where subjected to the plasma treatments described earlier, and angles of contact were measured for the ink noted below.

The ink used for the substrates whereon polyimide films and ITO were formed was made by adding methanol, glycerin, and ethoxy ethanol to a water dispersion of a hole injection material (a polyethylene dioxythiophene to which a polystyrene sulfonic acid had been added).

The oxygen plasma treatment was conducted under conditions of an oxygen gas flow volume of 500 SCCM, a power of 1.0 W/cm$^2$, and a pressure of 1 torr, while the CF$_4$ plasma treatment was conducted under conditions of a CH$_4$ gas flow volume of 900 SCCM, a power of 1.0 W/cm$^2$, and a pressure of 1 torr.

In the untreated stage, the ITO surface and polyimide surface actually exhibit water repellency, but both are made hydrophilic in the oxygen plasma treatment. It is known that, in a CF$_4$ plasma treatment, the hydrophilic property of an ITO surface is maintained as it is, while a polyimide surface is made water-repellent. When a glass substrate was subjected to the same treatments, it exhibited angles of contact of 20 to 30 degrees after CF$_4$ plasma treatment.

With respect to organic solvent systems such as xylenes, etc., which generally have low surface tensions, when the same consecutive plasma treatments were performed, ITO surfaces exhibited an angle of contact of 10 degrees therefor and polyimide surfaces exhibited an angle of contact of 50 degrees therefor.

Polyimide film surfaces processed by the plasma treatments noted above were subjected to ESCA analysis. The results are given below in Table 2.

Table 2 [cf. orig.]
Key:
UNPROCESSED
O$_2$ PLASMA
CF$_4$ PLASMA

As is evident from Table 2, the oxygen plasma treatment results in an increase in oxygen atoms, while the CF$_4$ plasma treatment results in a dramatic increase in the quantity of fluorine atoms and fluoridation. The bonding modes showed that —COOH and —COH were initially formed in the oxygen plasma treatment, and that Teflonization (—CF$_2$—) was induced by the CF$_4$ plasma treatment.

The Teflonization resulting from the plasma treatments noted above is also confirmed for cases wherein a negative resist comprising an acrylic skeleton was used. [These treatments] are thus very effective in modifying the surfaces of organic substances wherewith pattern formation is possible by photolithography.

It was possible to obtain similar results also in cases where consecutive plasma treatments were performed under atmospheric pressure, power of 300 W, and electrode-substrate distance of 1 mm, with the oxygen gas plasma conditions being an oxygen gas flow volume of 80 ccm, a helium gas flow volume of 10 liters/min, and a transporting speed of 10 mm/s, and the CF$_4$ plasma conditions being a CF$_4$ gas flow volume of 100 ccm, a helium gas flow volume of 10 liters/min, and a transporting speed of 5 mm/s. It is very effective to use atmospheric-pressure plasma because the time required to create a vacuum in the process chamber can be saved and the same surface modification can be effected more simply.

When a fluorine-based gas plasma treatment is performed, although CF$_4$ was used in the case described above, this does not pose a limitation, and other fluorine-based gasses such as NF$_3$ and SF$_6$, for example, can be used.

It is possible to control the wettability (surface energy) not only by the process time, but also by such parameters as the gas flow volume, power, and electrode-substrate distance, etc.

Thus it is possible with the same consecutive oxygen-CF$_4$ plasma processing to perform surface modification so as to effect liquid affinity in an inorganic substance surface and liquid repellency in an organic substance surface.

(9) Ninth Embodiment

A thin film formation method and a manufacturing method for organic EL elements comprising organic semiconductor thin films relating to a ninth embodiment of the present invention are now described, making reference to the drawings.

FIG. 23A-23E are process cross-sections representing a method of manufacturing organic EL elements.

Figure 23A:
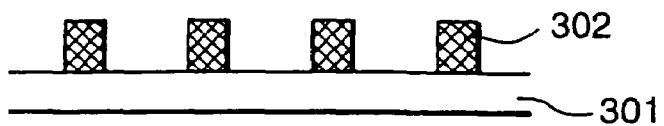
FIG. 23[A-23E] are process cross-sections representing a method of manufacturing organic EL elements pertaining to a ninth embodiment of the present invention.

In the process diagrammed in FIG. 23A, banks 302 made of a polyimide are formed by photolithography on an ITO substrate 301. The pattern may be a striped pattern or a pattern wherein circular shapes are removed. The material forming the banks is not limited to a polyimide, and any organic material capable of patterning by photolithography can be used.

Figure 23B:
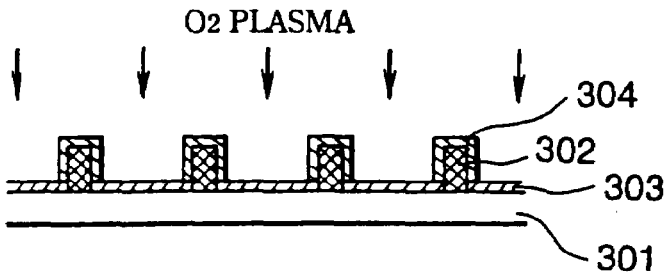

In the process diagrammed in FIG. 23B, an oxygen plasma treatment is performed for 1 minute with an oxygen gas flow volume of 500 SCCM, power of 1.0 W/cm$^2$, and pressure of 1 torr as conditions. Atmospheric-pressure plasma treatment can also be performed with a power of 300 W, electrode-substrate distance of 1 mm, oxygen gas flow volume of 80 ccm, helium gas flow volume of 100 liters/min, and transporting speed of 10 mm/s. In the oxygen plasma treatment a hydrophilic ITO surface 3 and a polyimide layer 304 that is activated (made hydrophilic) are formed. The oxygen plasma treatment exhibits effectiveness in ashing polyimide residue on the ITO.

Figure 23C:
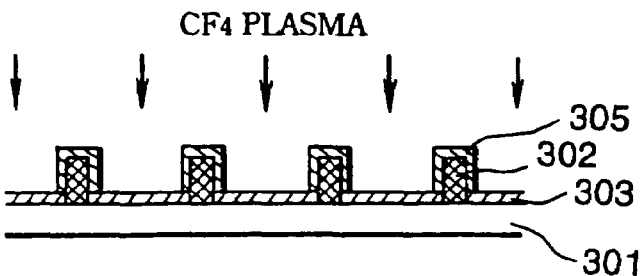

Following thereupon, in the process diagrammed in FIG. 23C, CF$_4$ plasma treatment is conducted for 30 minutes with a CF$_4$ gas flow volume of 900 SCCM, a power of 1.0 W/cm$^2$, and a pressure of 1 torr. Atmospheric-pressure plasma treatment may also be performed under conditions of an electrode-substrate distance of 1 mm, CF$_4$ gas flow volume of 100 ccm, helium gas flow volume of 10 liter/min, and transporting speed of 5 mm/s. The polyimide surface can be modified to a Teflon-treated liquid-repellent surface 305 while maintaining the hydrophilic ITO surface 303.

When the contamination on the substrate surface is of a mild degree, similar effectiveness can be obtained, without conducting the oxygen plasma treatment, by performing the CF$_4$ plasma treatment for 30 to 60 minutes under conditions of a CF$_4$ gas flow volume of 900 SCCM, power of 1.0 W/cm$^2$, and pressure of 1 torr.

Figure 23D:
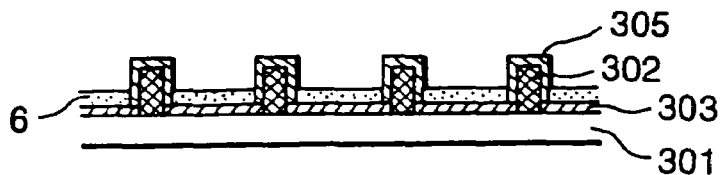

In the process diagrammed in FIG. 23D, a hole injection layer 306 is formed by spin coating. By adjusting the surface tension of the hole injection layer material liquid, the hole injection layer material can be patterned exclusively inside the ITO pixels. The spin-coating solution used was a water dispersion of polyethylene dioxythiophene and polystyrene sulfonic acid diluted with ethoxy ethanol and methanol (totaling 75 percent) and adjusted to a surface tension of 30 dyne/cm. For the hole injection layer material liquid, the plasma-treated ITO surfaces exhibit an angle of contact of 10 degrees or less, and are therefore evenly coated. At the plasma-treated polyimide surface, moreover, an angle of contact of 60 degrees or greater is exhibited, wherefore the banks are not coated, and no cross-talk is induced. A hole injection layer material ink may also be formed as a patterned film inside the ITO pixels by an ink jet process. The method of the ink jet process can yield significant savings in material.

Figure 23E:
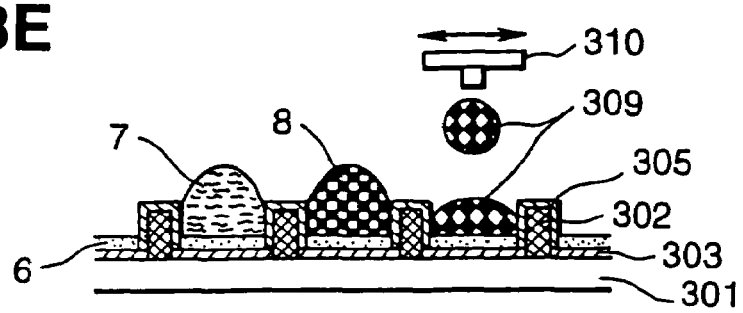

In FIG. 23E, light-emitting layers are formed in three colors, R, G, and B, by discharging a red light emitting layer material ink 307, a green light emitting layer material ink 308, and a blue light emitting layer material ink 309 into respectively prescribed pixels from an ink jet head 310. The ink used for the green light emitting layer material was made by diluting a PPV precursor liquid with a mixture liquid of DMF, glycerin, and diethylene glycol. The ink used for the red light emitting layer material was made by adding red pigment rhodamine 101 to the green ink made with PPV, in a ratio of 1.5 wt % relative to the PPV. The ink used for the blue light emitting layer material was an ink made by dissolving a polydioctyl sulfluorine in xylene. The angles of contact of the light emitting material layer inks 307, 308, and 309 on the plasma-treated polyimide surfaces are 60 degrees or greater, wherefore superfine patterning is possible with no color mixing. When forming monochrome organic EL elements, the light emitting layer can be formed by spin coating.

By employing the plasma treatments described above, a substrate may also be used whereon banks are formed in two layers, employing a glass layer for the lower layer so that the angle of contact with the hole injection layer material liquid or light emitting layer ink is within a range of 20 to 30 degrees. It is possible to avoid the danger of shorting at the bank skirts.

(10) Tenth Embodiment

A thin film formation method and a manufacturing method for color filters comprising colored thin films relating to a tenth embodiment of the present invention are now described, making reference to the drawings.

FIG. 24A-24D are process cross-sections representing a color filter manufacturing method.

Figure 24A:
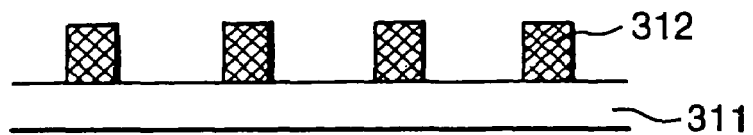
FIG. 24[A-24D] are process cross-sections representing a method of manufacturing a color filter pertaining to a tenth embodiment of the present invention.

In the process diagrammed in FIG. 24A, a resin BM (black matrix) 312 is formed by photolithography on a glass substrate 311. The pattern may be a striped pattern or a pattern wherein circular shapes are removed.

Figure 24B:
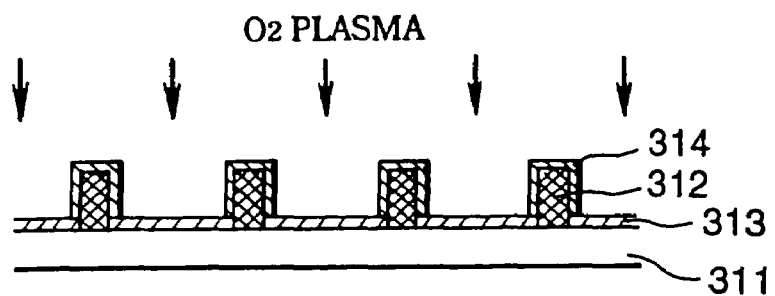
Figure 24C:
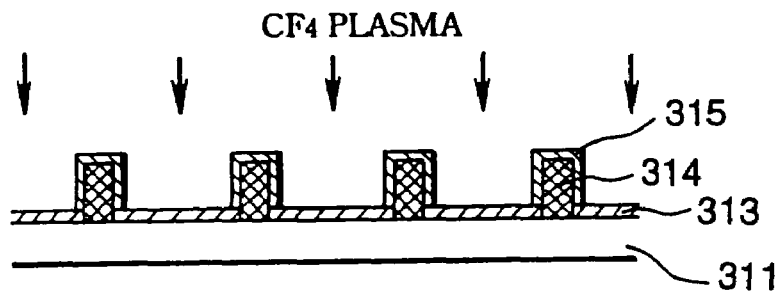

In the process diagrammed in FIG. 24B, an oxygen plasma treatment is performed for 1 minute with an oxygen gas flow volume of 500 SCCM, power of 1.0 W/cm$^2$, and pressure of 1 torr as conditions. Atmospheric-pressure plasma treatment can also be performed with a power of 300 W, electrode-substrate distance of 1 mm, oxygen gas flow volume of 80 ccm, helium gas flow volume of 100 liters/min, and transporting speed of 10 mm/s. In the oxygen plasma treatment a hydrophilic glass surface 13 and a resin BM layer 314 that is activated (made hydrophilic) are formed. The oxygen plasma treatment exhibits effectiveness in ashing resin residue on the glass.

Following thereupon, in the process diagrammed in FIG. 23C, CF$_4$ plasma treatment is conducted for 30 minutes with a CF$_4$ gas flow volume of 900 SCCM, a power of 1.0 W/cm$^2$, and a pressure of 1 torr. Atmospheric-pressure plasma treatment may also be performed under conditions of an electrode-substrate distance of 1 mm, CF$_4$ gas flow volume of 100 ccm, helium gas flow volume of 10 liter/min, and transporting speed of 5 mm/s. The resin BM surface can be modified to a Teflon-treated ink-repellent surface 315 while maintaining the hydrophilic glass surface 313.

When the contamination on the substrate surface is of a mild degree, similar effectiveness can be obtained, without conducting the oxygen plasma treatment, by performing the CF$_4$ plasma treatment for 30 to 60 minutes under conditions of a CF$_4$ gas flow volume of 900 SCCM, power of 1.0 W/cm$^2$, and pressure of 1 torr.

Figure 24D:
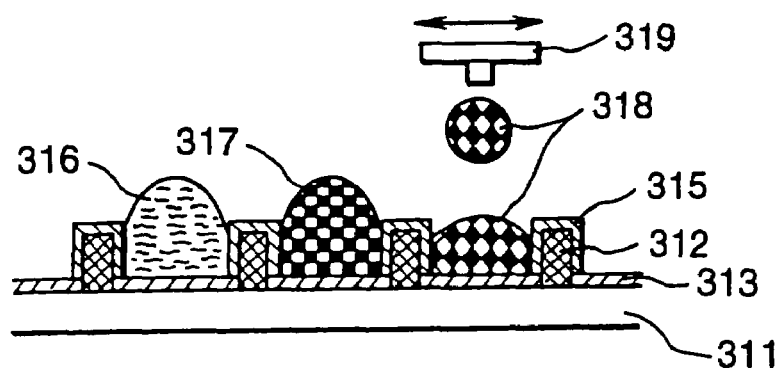

In the process diagrammed in FIG. 24D, a filter layer is formed in three colors, R, G, and B, by discharging a red light transmitting pigment ink 316, a green light transmitting pigment ink 317, and a blue light transmitting pigment ink 318 in respectively prescribed pixels from an ink jet head 319. The angles of contact of the pigment inks 317, 318, and 319 on the plasma-treated resin BM surface are 60 degrees or greater, wherefore superfine patterning is possible with no color mixing.

By employing the plasma treatments described above, a substrate may also be used whereon banks are formed in two layers, employing a material for the lower layer wherewith the angle of contact with the pigment ink is within a range of 20 to 50 degrees. It is possible to avoid the danger of color loss and film thickness irregularities.

(11) 11th Embodiment

A surface modification method and thin film formation method relating to an 11th embodiment of the present invention are now described, making reference to the drawings.

FIG. 25A-25D diagram the benefits of forming banks in two layers, namely of an inorganic substance and of an organic substance.

Figure 25A:
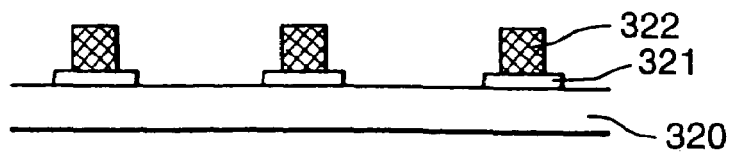
FIG. 25[A-25D] are process cross-sections representing a manufacturing method for forming banks in two layers, of an inorganic substance and of an organic substance, respectively, pertaining to an 11th embodiment of the present invention.

In the process diagrammed in FIG. 25A, laminated banks comprising a glass lower layer 321 and a polyimide upper layer 322 are formed by photolithography on an ITO substrate 20.

Figure 25B:
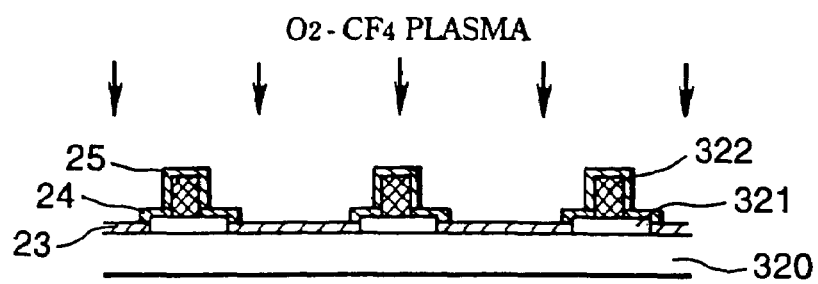

In the process diagrammed in FIG. 25B, the oxygen plasma and fluorine plasma treatments indicated in the eighth to tenth embodiments are conducted successively. The ITO substrate layer and the lower bank layer glass surface are made hydrophilic, while the upper bank layer polyimide is made liquid-repellent.

Figure 25C:
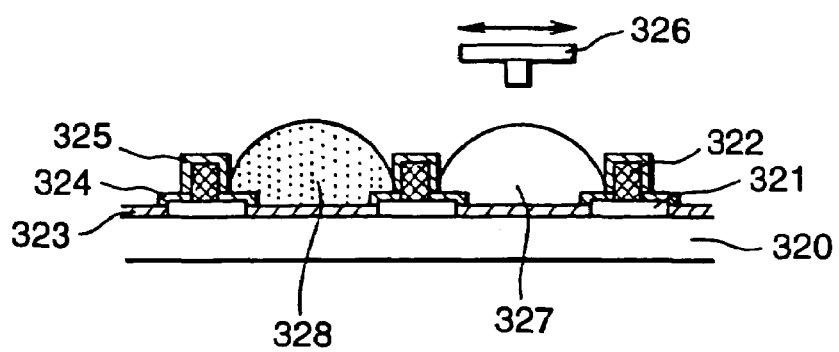

In the process diagrammed in FIG. 25C, liquid thin film materials having different characteristics are coated in adjacent depressions by discharging a thin film material ink A 327 and a thin film material ink B 328 from an ink jet head 326. After the plasma treatment, the angles of contact indicated for the thin film material ink are 20 degrees or less at the ITO surface 323, 30 to 40 degrees in the lower bank layer glass surface 324, and 90 degrees in the upper bank layer polyimide surface 325.

Figure 25D:
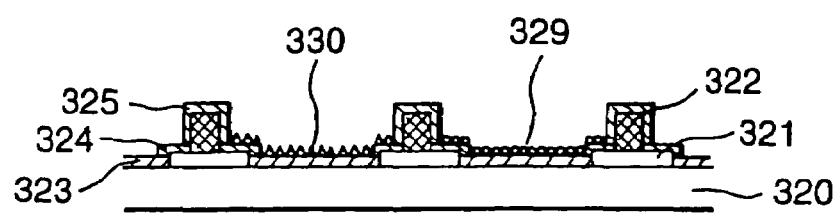

After baking, as diagrammed in FIG. 25D, the thin films A 329 and B 330 are obtained. The plasma-treated polyimide surface 325 exhibits strong ink repellency, wherefore, a flat film is sometimes not formed about periphery of the bank skirts that are formed of polyimide. However, the ITO surface 323 and the glass surface 324 both exhibit ink affinity, wherefore film formation also occurs about the periphery of the lower bank skirts formed of glass and a flat film is formed on the ITO surface. In the case of an element structured with an organic thin film sandwiched between ITO and an electrode, as in an organic EL element, it is possible to prevent shorts from occurring because no film is formed on the ITO. In the manufacture of color filters, moreover, this is very effective in preventing the color irregularities caused by film thickness irregularities.

As based on the eighth to 11th embodiments, as described in the foregoing, after subjecting a substrate having banks formed of an organic substance on the same substrate to an oxygen gas plasma treatment, that substrate is immediately subjected to a fluorine-based gas plasma treatment, thereby imparting semi-permanent liquid repellency to the banks while maintaining the liquid affinity of the substrate surface.

By using the methods described in the foregoing, furthermore, patterns wherein the surface energy is controlled can be formed by a simple method on the same substrate, whereupon it becomes possible to form finely patterned films with liquid thin film materials, not only using conventional coating methods such as spin coating, but also using a coating method based on an ink jet process. That being so, it becomes possible to manufacture color filters and full-color organic EL devices without color mixing, color irregularity, or cross-talk, simply and at low cost.

What is claimed is:

1. A thin film patterning substrate, used for forming thin films in patterns by a dip process or spin-coating process, comprising:
    a surface on which banks and areas to be coated are formed, the areas being partitioned by said banks;
    said banks being formed in two layers including a lower-layer inorganic substance and an upper-layer organic substance, and said areas to be coated being formed of an inorganic substance,
    a thin film arranged in at least one of said areas, the thin film being made from a thin film liquid.

2. The thin film patterning substrate according to claim 1, wherein said banks include side surfaces of a lower layer which are not covered by said organic substance.

3. The thin film patterning substrate according to claim 1, wherein the thin film patterning substrate is treated by a surface treatment such that an angle of contact between the surface of the banks formed of the organic substance and a surface of a thin film liquid forming the thin films is 50° or greater, an angle of contact between the surface of the banks formed of the inorganic substance and the surface of the thin film liquid is 20° to 50°, and an angle of contact between the surface of said areas and the surface of the thin film liquid is 30° or less.

* * * * *